(12) United States Patent
Ortiz et al.

(10) Patent No.: US 11,765,843 B2
(45) Date of Patent: Sep. 19, 2023

(54) HOUSING FOR AN ELECTRONIC CONTROL UNIT AND METHOD OF MANUFACTURE

(71) Applicant: Robert Bosch GmbH, Stuttgart (DE)

(72) Inventors: Luis Angel Ramirez Ortiz, Toluca (MX); Evelin Gaytan Almeyda, Toluca (MX); Roger John Narlock, Sr., Clarkston, MI (US); George Marutz, Huntington Woods, MI (US); Kevin Orava, Shelby Township, MI (US)

(73) Assignees: Robert Bosch LLC, Broadview, IL (US); Robert Bosch GmbH, Stuttgart (DE)

( * ) Notice: Subject to any disclaimer, the term of this patent is extended or adjusted under 35 U.S.C. 154(b) by 137 days.

(21) Appl. No.: 17/235,092

(22) Filed: Apr. 20, 2021

(65) Prior Publication Data

US 2022/0338359 A1    Oct. 20, 2022

(51) Int. Cl.
| | |
|---|---|
| *H01R 13/04* | (2006.01) |
| *H01R 13/405* | (2006.01) |
| *H05K 5/00* | (2006.01) |
| *H01R 43/24* | (2006.01) |
| *H01R 12/58* | (2011.01) |

(52) U.S. Cl.
CPC ........... *H05K 5/0069* (2013.01); *H01R 13/04* (2013.01); *H01R 13/405* (2013.01); *H01R 43/24* (2013.01); *H01R 12/58* (2013.01); *H05K 5/0047* (2013.01)

(58) Field of Classification Search
CPC .... H01R 13/04; H01R 13/405; H01R 13/502; H01R 43/24; H05K 5/0047; H05K 5/0069; H02K 5/225; H02K 5/04; B60R 16/0239; F16H 61/32
See application file for complete search history.

(56) References Cited

U.S. PATENT DOCUMENTS

| | | | |
|---|---|---|---|
| 5,299,945 A | 4/1994 | Norden | |
| 5,697,816 A * | 12/1997 | Wu | ........................ H01R 43/24 439/660 |
| 6,132,011 A | 10/2000 | Iwamura et al. | |
| 6,203,293 B1 | 3/2001 | Yamamoto et al. | |
| 11,239,602 B2 * | 2/2022 | Yoder | .................... H05K 5/006 |
| 2018/0251043 A1 | 9/2018 | Falster et al. | |

* cited by examiner

*Primary Examiner* — Vanessa Girardi
(74) *Attorney, Agent, or Firm* — Kelly McGlashen; Maginot, Moore & Beck LLP

(57) ABSTRACT

A housing assembly for an electronic circuit including an electronic control unit (ECU) is a low-profile, generally rectangular device that includes a container, a cover that closes an open end of the container, and a printed circuit board disposed in the housing. The container includes an input electrical connector and an output electrical connector formed at opposed ends of the housing. The output electrical connectors includes electrically conductive pins having an irregular shape and that are partially embedded in the container in such a way that each pin has zero degrees of freedom of movement relative to the container.

18 Claims, 11 Drawing Sheets

HOUSING FOR AN ELECTRONIC CONTROL UNIT AND METHOD OF MANUFACTURE

BACKGROUND

An electronic control unit (ECU) is a device that may be used, for example, to control the components of a motor assembly used in a vehicle to configure the position of elements of the vehicle such as a window, mirror, seat and/or door. The ECU includes a housing and a printed circuit board (PCB) that is mounted within the housing. The PCB may support a controller, computer memory, embedded software, communication devices, electronic circuitry and other ancillary devices. The ECU housing may also include one or more electrical connectors. The connectors may be configured to receive an electrical harness that connects the ECU to an external device such as the vehicle engine, a motor assembly or other device. Within the connectors, pins may be used to provide an electrical connection between the harness and the PCB. In some conventional plastic ECU housings, warpage of the housing can occur during manufacture or in some use environments, which in turn results in unstable pin configuration within the electrical connectors. In addition, environmental conditions during vehicle use such as vibration, impacts, humidity, corrosion, high separation forces, etcetera, can also result in pin instability relative to the ECU housing. Since pin instability relative to the ECU housing can result in faulty electrical connections with the ECU, it is desirable to provide an ECU housing in which pins are stably retained and the reliability of electrical connections is improved.

SUMMARY

In some embodiments, an ECU is an assembly that includes an ECU housing and a PCB disposed in the housing. The PCB supports a controller, and electronics devices and structures that support the function of the controller. The ECU housing includes a container, a lid that closes an open end of the container and electrical connectors that permit the ECU to be connected to external devices. The connectors include pins that are embedded in a sidewall of the container in such a way that a first end of each pin resides within the container and forms an electrical connection with terminals of the PCB, and a second end of each pin is disposed outside the container, and is surrounded by a protective flange. As used herein, the term embedded refers to being tightly enclosed by and encased within the plastic material of the housing. This can be achieved, for example, by manufacturing the housing with the pins in place in an overmolding process. Moreover, the pins are shaped to cooperate with the encasing housing material in such a way that the pin is firmly fixed relative to the housing sidewall. In particular, the pins are supported in the housing sidewall in such a way as to have zero degrees of freedom of movement relative to the housing sidewall. As a result, ECU housing is provided in which pins are stably retained and the reliability of electrical connections is improved. Advantageously, a benefit of using the overmolding process is that there are fewer production steps during assembly of the ECU housing, whereby the cost of production is reduced as compared to some conventional ECU housings.

In some aspects, a housing assembly includes a housing having a container and a lid. The container includes a base and a sidewall that protrudes from base in a direction perpendicular to the base. A first end of the sidewall is connected to the base, and a second end of the sidewall defines a container opening. The lid is shaped and dimensioned to close the container opening. In addition, the housing assembly includes electrically conductive pins that extend through a first portion of the sidewall. A first end of each pin includes a first electrical connection portion. A second end of each pin includes a second electrical connection portion. Each pin is partially embedded in the container in such a way that the first electrical connection portion is exposed and is disposed outside the housing, and the second electrical connection portion is exposed and is disposed inside the housing. In addition, portions of the pins that are embedded in the container are irregularly shaped and are engaged with the container in such a way that each pin has zero degrees of freedom of movement relative to the container.

In some embodiments, the first electrical connection portion has a female electrical connection configuration.

In some embodiments, the container includes an inner buttress that adjoins a first portion of the sidewall so as to protrude inward from an inner surface of the sidewall, and an outer support block that adjoins the first portion of the sidewall so as to protrude outward from an outer surface of the sidewall. Each pin extends through the first portion of the sidewall, the inner buttress and the outer support block.

In some embodiments, the outer support block is encircled by a tubular shroud.

In some embodiments, the container includes a shroud that protrudes outwardly from the first portion of sidewall. The shroud surrounds the first ends of the pins and defines an outer opening configured to engage with corresponding mating connector.

In some embodiments, the housing has height, length and width dimensions. The height dimension corresponds to a distance along a Z axis between an outer surface of the base and an outer surface of the lid. The length dimension corresponds to a distance along a Y axis between an outer surface of the first portion of the sidewall and an outer surface of a second portion of the sidewall that is parallel to, and spaced apart from, the first portion of the sidewall. The width dimension corresponds to a distance along an X axis between a third portion of the sidewall and a fourth portion of the sidewall. The third and fourth portions of the sidewall are perpendicular to the first and second portions of the sidewall and spaced apart from each other. The X, Y and Z axes are mutually orthogonal, and the container is configured to prevent axial movement of each pin relative to the X, Y and Z axes, and to prevent rotational movement of each pin about the X, Y and Z axes.

In some embodiments, each pin includes a first pair of opposed planar surfaces that are perpendicular to the X axis, a second pair of opposed planar surfaces that are perpendicular to the Y axis, and a third pair of opposed planar surfaces that are opposed to the Z axis. Each of the first pair, second pair and third pair of opposed planar surfaces abuts the container, whereby the container is configured to prevent axial movement of each pin relative to the X, Y and Z directions, and to prevent rotational movement of each pin about the X, Y and Z axes.

In some embodiments, the housing assembly includes a printed circuit board disposed inside the housing. The printed circuit board includes electrical connection plugs, the second electrical connection portion of each pin being electrically connected to a corresponding one of the electrical connection plugs.

In some embodiments, the portion of each pin embedded in the container has an L shaped profile.

In some embodiments, each pin has a through opening, and material used to form the container fills the through opening.

In some embodiments, each pin has a flange that protrudes from a surface of the respective pin.

In some embodiments, at least some of the pins have an integral spring element that protrudes from a side surface of the respective pin.

In some embodiments, the pins are fixed relative to the container via an overmolding manufacturing process.

In some aspects, a housing assembly includes a housing having a container and a lid. The container includes a base, and a sidewall that protrudes from base in a direction perpendicular to the base. A first end of the sidewall is connected to the base, and a second end of the sidewall defines a container opening. The lid is shaped and dimensioned to close the container opening. In addition, the housing assembly includes pins that extend through a first portion of the sidewall. Each pin includes a first end that includes a female first electrical connection portion, and a second end that includes a second electrical connection portion. Each pin includes a longitudinal portion that extends in a first direction that is perpendicular to the first portion of the sidewall. The longitudinal portion includes the first electrical connection portion, and the first electrical portion is oriented to form an electrical connection in a direction parallel to the first direction. Each pin includes a transverse portion that extends in a second direction that is perpendicular to the longitudinal axis and a lid-facing surface of the base. The transverse portion includes the second electrical connection portion. The second electrical connection portion is oriented to form an electrical connection in a direction parallel to the second direction. Each pin is partially embedded in the container in such a way that the first electrical connection portion is exposed and is disposed outside the housing, the second electrical connection portion is exposed and is disposed inside the housing, and an embedded portion of the pin is engaged with the container in such a way that the pin has zero degrees of freedom of movement relative to the container.

In some aspects, a method of manufacturing a housing assembly is described. The housing assembly includes a housing and pins that protrude from the housing. The method includes providing electrically conductive pins. Each pin includes a first end, the first end having a female first electrical connection portion, a second end, the second end opposed to the first end and having a second electrical connection portion, and a midportion disposed between the first end and the second end. The midportion has an elbow shape such that the first end extends along a first axis and the second end extends along a second axis that is perpendicular to the first axis. The method includes forming the housing about the pins so that each pin is partially embedded in a portion of the housing in such a way that the first electrical connection portion is disposed outside the housing, the second electrical connection portion is disposed inside the housing, and portions of the pin that are embedded in the housing are engaged with the housing in such a way that the pin has zero degrees of freedom of movement relative to the housing.

In some embodiments, the step of forming the housing includes an overmolding process in which the pins are partially embedded.

In some embodiments, the step of forming the housing includes forming a container that has a base, and a sidewall that protrudes from base in a direction perpendicular to the base. A first end of the sidewall is connected to the base, and a second end of the sidewall defines a container opening.

In some embodiments, the step of providing electrically conductive pins includes arranging the pins in an array in which each pin is spaced apart from and parallel to an adjacent pin of the array, and the step of providing electrically conductive pins is performed before the step of forming the housing.

DETAILED DESCRIPTION

Figure 1:
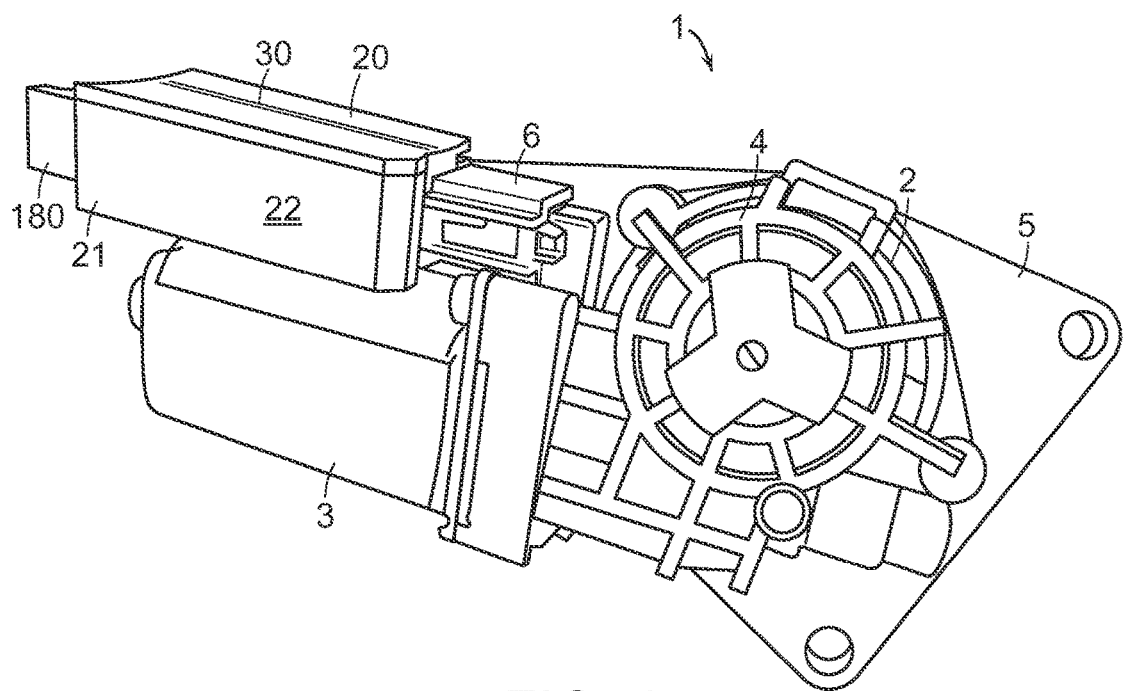
FIG. 1 is perspective view of a seat motor assembly that includes an electric motor unit and an ECU that is directly and detachably connected to the electric motor unit via respective electrical connectors.
Figure 2:
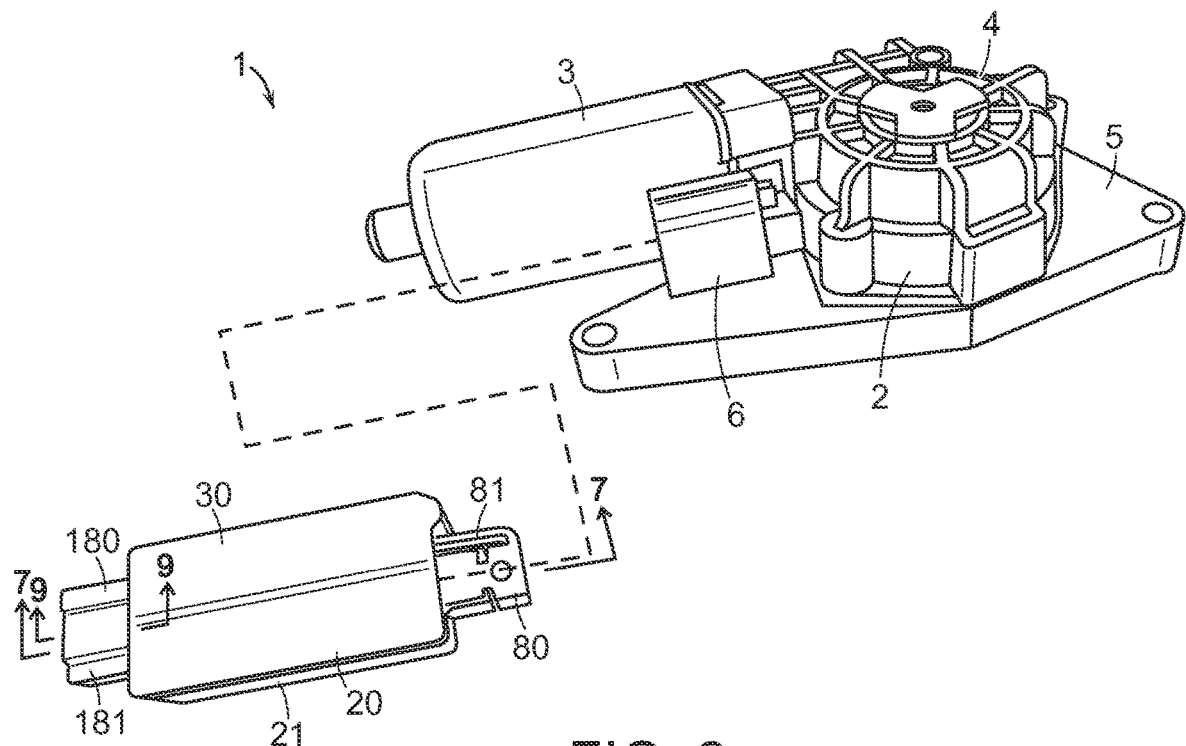
FIG. 2 is an exploded perspective view of the seat motor assembly of FIG. 1.
Figure 3:
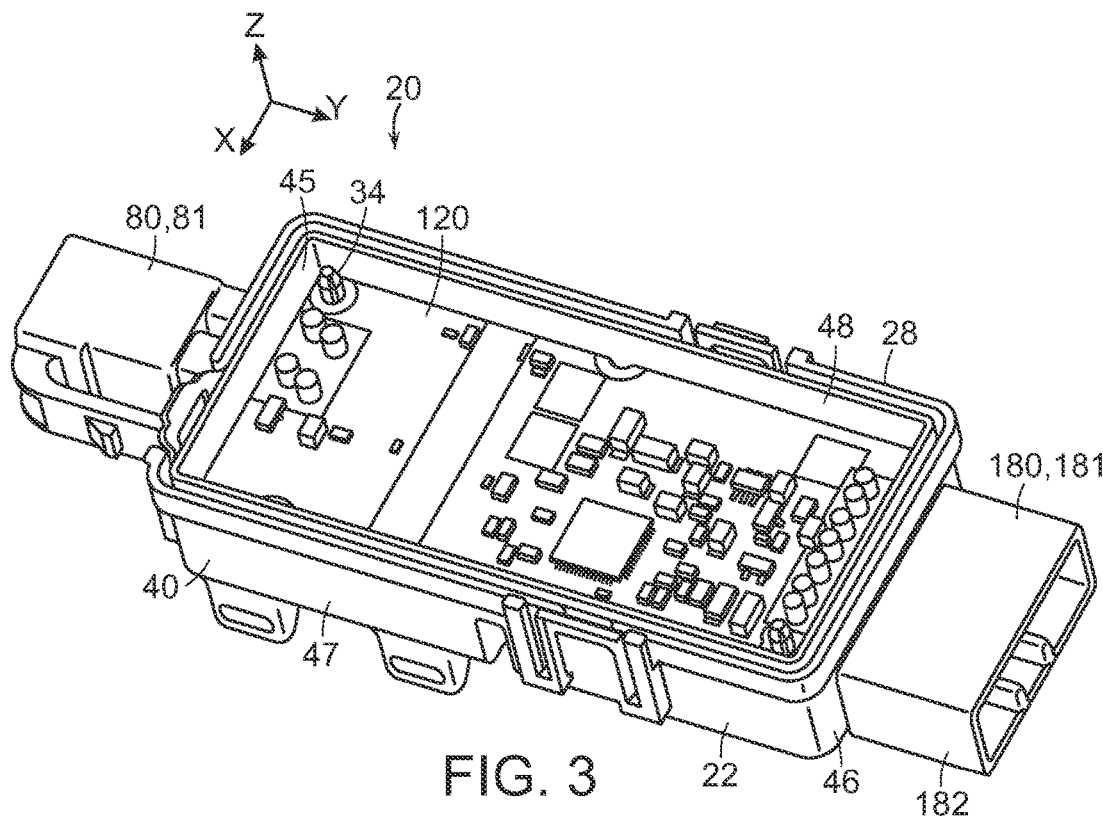
FIG. 3 is a top perspective view of the ECU shown with the housing lid omitted and illustrating the arrangement of the PCB within the ECU housing.
Figure 4:
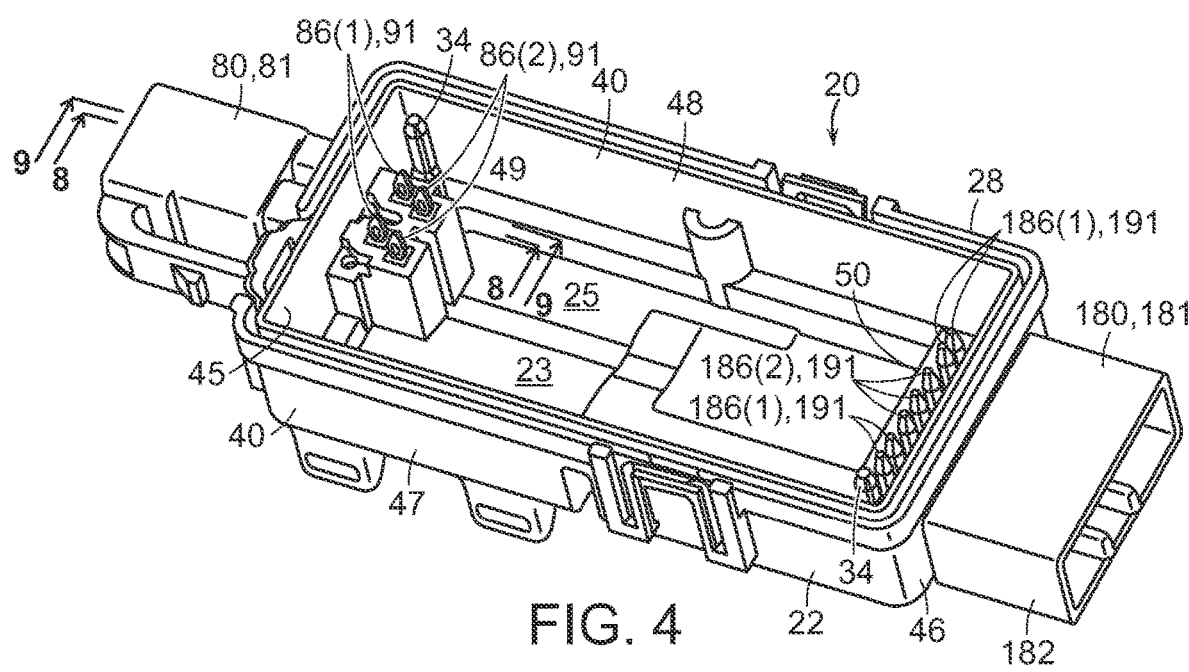
FIG. 4 is a top perspective view of the ECU shown with the housing lid and PCB omitted illustrating the interior structure of the ECU housing.
Figure 5:
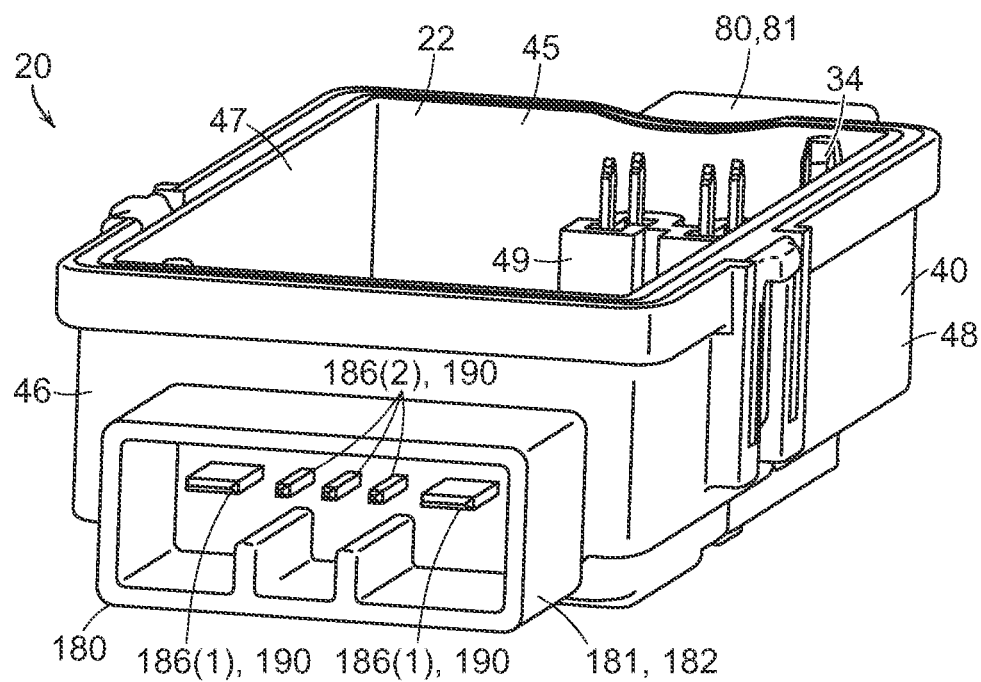
FIG. 5 is a perspective view of the ECU housing illustrating a first end of the ECU housing including the input connector.
Figure 6:
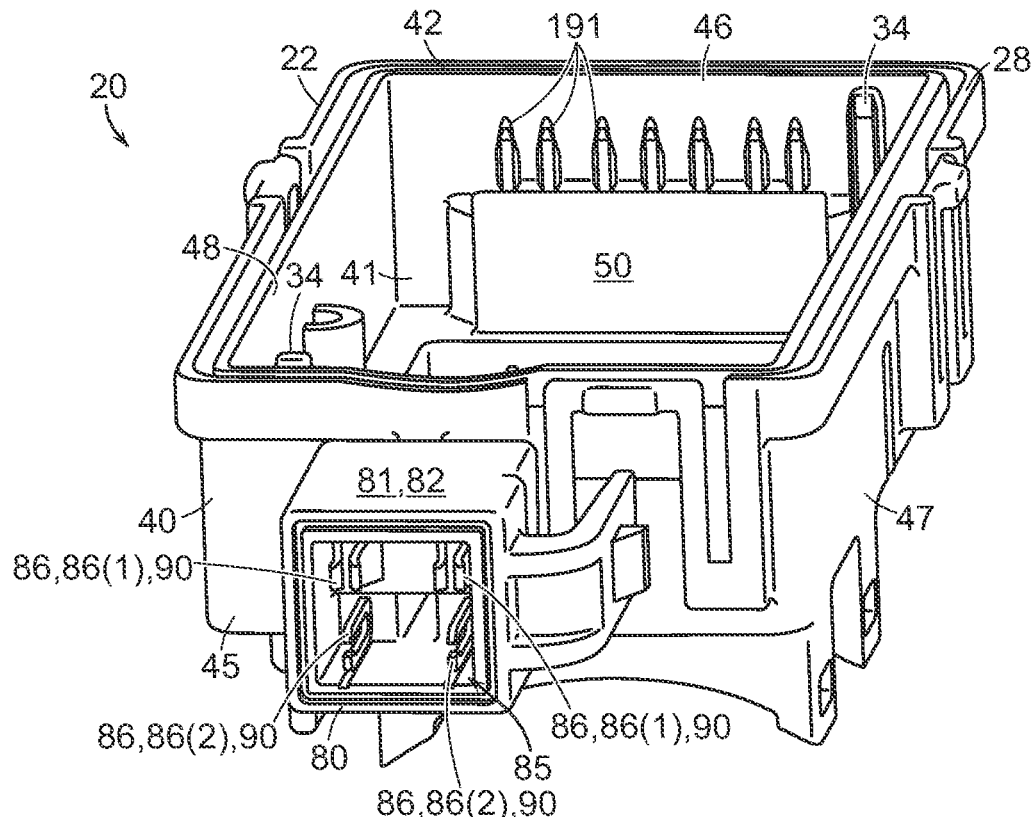
FIG. 6 is a perspective view of the ECU housing illustrating a second end of the ECU housing including the output connector.
Figure 7:
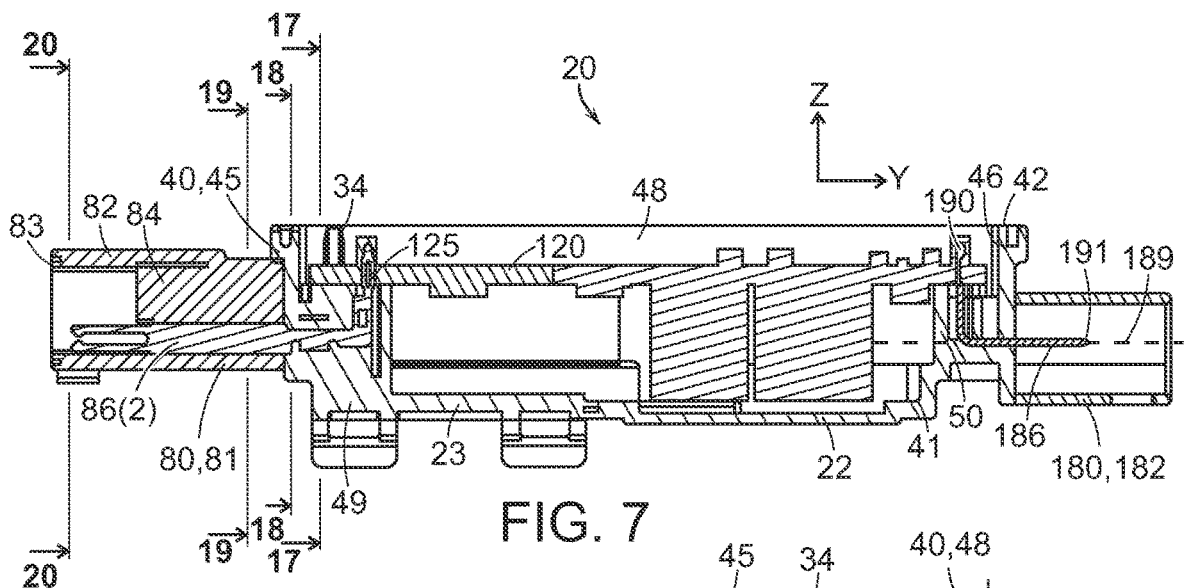
FIG. 7 is cross-sectional view of the ECU housing as seen along line 7-7 of FIG. 2.

Referring to FIGS. 1-6, a motor assembly 1 includes an electric motor unit 2 and an ECU 20. The electric motor unit 2 includes an actuator 3 driven by a gear set (not shown) housed within a gear housing 4. The electric motor unit 2 is powered by an electrical signal received via a motor unit electrical connector 6 that is supported on the actuator 3, and the electrical motor unit 2 may be mounted to a structure of a vehicle using a mounting plate 5. The ECU 20 includes an ECU housing 21 and a PCB 120. The PCB 120 is disposed in the ECU housing 21 and is a rigid, multi-layer sheet of electrically insulating material that supports one or more controller processors (not shown) utilized to modulate the electrical signal output via an output connector 80. The PCB 120 supports electronic devices such as computer memory, embedded software, communication devices, electrolytic capacitors, power components, and/or other ancillary devices. The communication devices may include a wireless transmitter, wireless receiver, or wireless transceiver operable to provide wireless data communication between ECU 20 and one or more external devices, such as a Local Interconnect Network (LIN) hub. The PCB 120 also includes electrically conductive tracks (not shown) used to electrically connect the electronic components to each other and/or to connection plugs 125 that, in turn, permit connection of the electronic devices and structures of the PCB 120 to external devices.

The ECU housing 21 is separate from the housing of the electric motor unit 2, and includes the ECU output connector 80 and an ECU input connector 180. In the illustrated embodiment, the ECU output connector 80 and the ECU input connector 180 each include electrically conductive pins 86, 186 and an encircling shroud 81, 181 that are suitable for coupling with, and forming electrical connections with, existing vehicle electrical connectors. Structural details of the input and output connectors 80, 180 are discussed in detail below.

The ECU 20 receives power and data via the ECU input connector 180. The ECU input connector 180 is disposed on a side of the ECU housing 21 opposed to the ECU output connector 80, and may be configured to receive power and data from the LIN. The data may comprise sensor data from a sensor, control data from a processor in data communication with the LIN, or communication data. Other configurations may utilize other data transmission through the ECU input connector 180.

The ECU 20 is configured to act as a go-between between the conventional power supply of the vehicle and electric motor unit 2 by interfacing directly with the electric motor unit 2 via a detachable electrical connection between the ECU output connector 80 and the motor unit electrical connector 6. The housing 21 of the ECU 20 has a low-profile design that is advantageous for direct coupling to the electric motor unit 2, but other embodiments may utilize an adapter or connector cable. Direct coupling of the ECU 20 to the electric motor unit 2 may advantageously permit the coupled motor assembly to be housed together within the vehicle, such as within a seat, console, or behind a panel. In addition, the direct coupling of the ECU 20 to the electric motor unit 2 may improve the electromagnetic compliance (EMC) of the device by minimizing the length of the electrical leads that couple the ECU 20 and the electric motor unit 2. Minimizing the length of the electrical leads may also optimize the EMC of the system by minimizing portions of the system susceptible to electromagnetic interference (EMI) from environmental or other external sources.

The ECU 20 may advantageously permit vehicles with existing conventional electric motors to be retrofitted with desired control functions such as automated control and user control. In this manner, electric motors such as the electric motor unit 2 may effectively be retrofitted to become modular smart motors via the ECU 20. Since both output connector 80 and input connector 180 may be detachably connected, the coupling may be reversed to restore a vehicle to its original configuration or permit for replacement, repair, or upgrade of controller components.

Referring to FIGS. 3-9, the ECU housing 21 is a low-profile, generally rectangular device. The ECU housing 21 is an assembly that includes a container 22, and a lid 30 that closes an open end 28 of the container 22.

The lid 30 of the ECU housing 21 is shaped and dimensioned to close the container open end 28. In the illustrated embodiment in which the container 22 has a rectangular container open end 28, the lid 30 has a rectangular profile. The lid 30 may be secured to the container 22 using fasteners and/or a press fit engagement with the sidewall second end 42. In some embodiments, a gasket (not shown) may be disposed between the sidewall second end 42 and the lid 30.

The container 22 includes a plate-like base 23, and a sidewall 40 that protrudes from the base 23. In addition, the container 22 includes the ECU output and input connectors 80, 180. The sidewall 40 protrudes from the base 23 in a direction perpendicular to an inner (e.g., lid-facing) surface 25 of the base 23 and extends around a periphery of the base 23. The sidewall 40 is a four-sided structure that includes a sidewall first end 41 that is joined to the base 23, and a sidewall second end 42 that is opposed to the sidewall first end 41 and defines the container open end 28. The four sides of the sidewall 40 include a first sidewall portion 45, a second sidewall portion 46 that is parallel to, and spaced apart from, the first sidewall portion 45, a third sidewall portion 47 that extends between the first and second sidewall portions 45, 46 on one side of the base 23, and a fourth sidewall portion 48 that is parallel to, and spaced apart from the third sidewall portion 47. The fourth sidewall portion 48 is disposed on a side of the base 23 opposed to the third sidewall portion 47, and the third and fourth sidewall portions 47, 48 are perpendicular to the first and second sidewall portions 45, 46.

The ECU housing 21 has a height dimension corresponding to a distance along a Z axis between an outer surface 26 of the base 23 and an outer surface 31 of the lid 30, and a length dimension corresponding to a distance along a Y axis between an outer surface of the first sidewall portion 45 and an outer surface of the second sidewall portion 46. In addition, the ECU housing 21 has a width dimension corresponding to a distance along an X axis between the third sidewall portion 47 and the fourth sidewall portion 48. The X, Y and Z axes (FIG. 3) are mutually orthogonal and provide a reference frame of the ECU housing 21.

The container 22 includes a generally rectangular first inner buttress 49 that is surrounded by the sidewall 40 and adjoins inner surfaces of the first sidewall portion 45 and the base 23, and a generally rectangular second inner buttress 50 that is surrounded by the sidewall 40 and adjoins inner surfaces of the second sidewall portion 46 and the base 23. The first and second buttresses 49, 50 provide structural reinforcement of the container 22, and receive and support portions of the pins 86, 186, as discussed in detail below. The lid-facing surfaces of the first and second buttresses 49, 50 are recessed relative to the sidewall second end 42, and portions of the PCB 120 rest on the lid-facing surfaces of the first and second buttresses 49, 50 whereby the PCB 120 is supported parallel to the base 23 and in a spaced relationship relative to the base 23 and the lid 30.

The container 22 includes locating posts 34 that protrude from the base 23 and that are used to locate the PCB 120 with respect to sidewall 40. Each post 34 includes a proximal end that is integrally formed with the base 23, and a distal end that is opposed to the proximal end. Each locating post 34 has sufficient length (e.g., a distance between proximal and distal ends) such that the distal end resides inside the container 22 adjacent to the container open end 28.

The container 22 includes the ECU output connector 80 that is formed integrally with the first sidewall portion 45. The ECU output connector 80 includes a first shroud 81, the first sidewall portion 45, the first inner buttress 49, and an array of the output connector pins 86 that extend through the first shroud 81.

The first shroud 81 includes a first tubular portion 82 and an outer support block 84. The first tubular portion 82 has the shape of a rectangular tube and protrudes outward from the outer surface of the first sidewall portion 45 in a direction perpendicular to the first sidewall portion 45. The first tubular portion 82 surrounds the outer support block 84, which protrudes from the outer surface of the first sidewall portion 45. In some embodiments, the first tubular portion 82 is configured to permit interlocking engagement with another electrical connector such as the motor unit electrical connector 6. The outer support block 84 is recessed relative to an open end 83 of the first tubular portion 82 and is at least partially aligned with the first inner buttress 49 in a direction parallel to the Y axis. Together with the first sidewall portion 45 and the first inner buttress 49, the outer support block 84 supports the output connector pins 86.

Portions of each of the output connector pins 86 are embedded in the container 22. More specifically, portions of each of the output connector pins 86 are embedded in the first outer support block 84, the first sidewall portion 45 and the first inner buttress 49. The embedded portions of the output connector pins 86 are irregularly shaped and are engaged with the container 22 in such a way that each output connector pin 86 has zero degrees of freedom of movement relative to the container 22 and is securely supported by the container 22 regardless of direction of a force applied to the pin 86, as discussed in detail below.

In the illustrated embodiment, the ECU output connector 80 includes four output connector pins 86 that are arranged in a two-by-two array 85. The two pins 86(1) of the array upper row (e.g., the row closest to the lid 30) are each an electrically conductive, alpha-type output connector pin, and the two pins 86(2) of the array lower row (e.g., the row closest to the base 23) are each an electrically conductive, beta-type output connector pin. Each alpha output connector pin 86(1) is aligned with a beta output connector pin 86(2) in the height direction of the ECU housing 21 (e.g., in a direction perpendicular to the base 23) and aligned with the other alpha output connector pin 86(1) in the width direction of the ECU housing 21 (e.g., in a direction perpendicular to the third sidewall portion 47). Each beta output connector pin 86(2) is aligned with the other beta output connector pin 86(2) in the width direction of the ECU housing 21. In the following description, references to general pin structures will include a general reference number without an appendix, for example output connector pins "86" refers to both the alpha and beta output connector pins. In addition, a reference number that is appended with "(1)" refers to a structure of the alpha output connector pin 86(1), and a reference number that is appended with "(2)" refers to a structure of the beta output connector pin 86(2).

Referring to FIGS. 7-16, details of the configuration of the alpha and beta output connector pins 86, and of engagement between the alpha and beta output connector pins 86 and the container 22 will now be described in detail.

Each of the of the alpha and beta output connector pins 86 includes a first end 87, a second end 88 and a mid portion disposed between the first end 87 and the second end 88. In addition, each of the of the alpha and beta output connector pins 86 is elongated along a longitudinal axis 89 that extends between the first end 87 and the second end 88. The first end 87 of each output connector pin 86 includes a female first electrical connection portion 90, and the second end 88 of each output connector pin 86 includes a male second electrical connection portion 91. When seen in side view (FIG. 15), the alpha and beta output connector pins 86 have a generally L-shaped profile that includes a longitudinal portion 68 and a transverse portion 69. The longitudinal portion 68 is elongated in a direction that is parallel to the longitudinal axis 89, and the first electrical connection portion 90 protrudes from one end of the longitudinal portion 68. The transverse portion 69 extends in a direction that is perpendicular to the longitudinal axis 89 and away from a lid-facing surface of the base 23. The second electrical connection portion 91 protrudes from one end of the transverse portion towards the lid 30. By this configuration, the first electrical connection portion 90 extends in a direction that is perpendicular to that of the second electrical connection portion 91.

In some embodiments, each of the alpha and beta output connector pins 86 may be formed of a thin strip of electrically conductive material that has been punched from a blank and folded and/or bent to achieve the illustrated configuration. As a result, the pins 86 are blade-like, having a material thickness that is small relative to overall length and height.

In the illustrated embodiment, the alpha output connector pins 86(1) include a folded portion 93 disposed between the first end 87 and a midpoint 92 of the pin 86(1). The folded portion 93 has a U-shaped cross section when the pin 86(1) is viewed in a direction parallel to the longitudinal axis 89(1). The legs 93(a), 93(b) of the folded portion 93 open facing one of the beta output connector pins 86(2). While one of the legs 93(a) is coincident with the longitudinal axis 89(1), the opposed leg 93(b) is spaced apart from the longitudinal axis 89(1) in a width direction of the pin 86(1). The legs 93(a), 93(b) of the folded portion 93 have protrusions 93(c) that protrude longitudinally and are bent to converge together to provide the female first electrical connection portion 90. In use, male pins of a mating electrical connector (not shown) are received in the space between the protrusions 93(c), and the terminal ends of the protrusions 93(c) engage, and form an electrical connection with, an outer surface of the male pins.

The alpha output connector pins 86(1) include a planar portion 94 disposed between the midpoint 92 and the pin second end 88. The planar portion 94 is coincident with the longitudinal axis 89(1). The height of the planar portion 94 is non-uniform such that the height of the pins 86(1) at the midpoint 92 is greater than the height of the pins 86(1) closer to the pin second end 88. A shoulder 99 is formed at the transition in heights. The shoulder 99 faces the pin second end 88. A rectangular spring element 95 is provided in the planar portion 94 at a location between the midpoint 92 and the shoulder 99. In the illustrated embodiment, the spring element 95 is a rectangular tab. The spring element 95 is integral with the planar portion 94 along one edge and protrudes from the planar portion 94 in such a way that an edge of the tab opposed to the one edge is spaced apart from the planar portion 94. As a result, the spring element 95 is at an acute angle relative to the planar portion 94. A first flange 96 is provided in the planar portion 94 at a location between the shoulder 99 and the second end 88. The first flange 96 protrudes from an edge of the pin 86(1) in a direction perpendicular to the longitudinal axis 89, and includes a central opening 97. In the illustrated embodiment, the first flange 96 protrudes in a direction opposed to that of the spring element 95. The elbow 98 of the pin 86(1) that provides the pin 86(1) with an L shape is disposed between the first flange 96 and the pin second end 88. Due to the elbow 98, the male second electrical connection portion 91 extends in a direction perpendicular to the longitudinal axis 89.

The alpha output connector pins 86(1) have a length dimension (e.g., the distance between the first and second ends 87, 88 of the pins 86(1)) that is much greater than their width and height dimensions. For example, the alpha output connector pins 86(1) may a length that is at least three times that of the width and height dimensions. In addition, the alpha output connector pins 86(1) have a height dimension (e.g., the dimension in a direction parallel to the insertion direction of the second electrical connection portion 91) that is greater than the width dimension (e.g., the dimension perpendicular to the longitudinal axis and the insertion direction of the second electrical portion 91). For example, the alpha output connector pins 86(1) may a height that is at about two times that of the width dimension. The thickness of the material used to form the alpha output connector pins 86(1) is very small relative to that of the length, height or width of the pins 86(1). For example, in the illustrated embodiment, the length of the alpha output connector pin 86(1) is at least 50 times the thickness of the material used to form the alpha output connector pin 86(1).

The beta output connector pins 86(2) may be formed of a thin strip of electrically conductive material that has been punched from a blank, and folded and bent to achieve the illustrated configuration. In the illustrated embodiment, the beta output connector pins 86(2) are generally planar and omit the folded portion of the alpha output connector pins 86(1). The beta output connector pins 86(2) are longer than the alpha output connector pins 86(1). The beta output connector pins 86(2) have a height dimension that is greater than that of the alpha output connector pins 86(1), and a width dimension that is less than that of the alpha output connector pins 86(1). The thickness of the material used to form the beta output connector pins 86(2) may be the same as that of the material used to form the alpha output connector pins 86(1).

Each of the beta output connector pins 86(2) includes an elongated slot 100 that opens at the pin first end 87 and defines a portion of the first electrical connection portion 90 of the beta output connector pins 86(2). In the illustrated embodiment, the slot 100 is elongated in a direction parallel to the longitudinal axis 89, and a longitudinal dimension of the slot 100 is in a range of 10 percent to 30 percent of the length of the beta output connector pin 86(2). The slot 100 has a necked portion 101 adjacent the pin first end 87. The slot 100 has a generally uniform height dimension in the region between the necked portion 101 and a blind end 114 of the slot 100. The remainder of the first electrical connection portion 90 of the beta output connector pins 86(2) is formed by the pin material that surrounds the slot 100. This material defines opposed, parallel arms 102(a), 102(b). Each of the parallel arms 102(a), 102(b) has an inward protrusion 103 corresponding to the necked portion 101 of the slot 100. In use, male pins of a mating electrical connector (not shown) are received in the slot 100, and the inward protrusions 103 serve as teeth that engage, and form an electrical connection with, an outer surface of the male pins.

Each of the beta output connector pins 86(2) includes a planar portion 104 disposed between the first electrical connection portion 90 and the second end 88. The planar portion 104 includes the midpoint 105 of the beta output connector pin 86(2). The height of the planar portion 104 is non-uniform such that the height of the pins 86(2) at the midpoint 105 is greater than the height of the pins 86(2) closer to the pin second end 88. A pair of shoulders 106, 107 are formed at the transition in heights, and each shoulder 106, 107 faces the pin second end 88. A second flange 108 is provided in the planar portion 94 at a location between the midpoint 105 and the second end 88. The second flange 108 protrudes from an edge of the pin 86(2) in a direction perpendicular to the longitudinal axis 89, and includes a central opening 109.

The elbow 112 of the pin 86(2) that provides the pin 86(2) with an L shape is disposed between the second flange 108 and the pin second end 88. Due to the elbow 112, the male second electrical connection portion 91 extends in a direction perpendicular to the longitudinal axis 89. A rectangular cutout 110 is provided in the planar portion 94 at a location between the elbow 112 and the second electrical connection portion 91.

In each of the beta output connector pins 86(2), the first electrical connection portion 90, the planar portion 104, the elbow 112, the rectangular cutout and the second electrical connection portion 91 lie in a plane that includes the longitudinal axis 89(2). In use, the plane is perpendicular to the container base 23.

The beta output connector pins 86(2) have a length dimension (e.g., the distance between the first and second ends 87, 88 of the pins 86(2)) that is much greater than their width and height dimensions. For example, the beta output connector pins 86(2) may a length that is at least five times that of the width and height dimensions. In addition, the beta output connector pins 86(2) have a height dimension (e.g., the dimension in a direction parallel to the insertion direction of the second electrical connection portion 91) that is greater than the width dimension (e.g., the dimension perpendicular to the longitudinal axis and the insertion direction of the second electrical portion 91). For example, the beta output connector pins 86(2) may a height that is at about two times that of the width dimension.

In the array 85, the alpha and beta output connector pins 86 are oriented so that the first flange of an alpha output connector pin 86(1) overlies the second flange 108 of the beta output connector pin 86(2) and so that the respective central openings 97, 109 are aligned in the z axis direction. In the array 85, the first end 87 of the alpha output connector pin 86(1) overlies the first end 87 of the beta output connector pin 86(2), and is flush with the first end 87 of the beta output connector pin 86(2) in the longitudinal direction. In addition, the longitudinal axis 89 of the alpha output connector pin 86(1) is offset in the X direction relative to the longitudinal axis 89 of the beta output connector pin 86(2). Still further, the second electrical connection portion 91 of the alpha output connector pins 86(1) are flush with the second electrical connection portion 91 of the beta output connector pins 86(2) in a height, or Z, direction.

Each of the alpha and beta output connector pins 86 is partially embedded in the container 22 in such a way that the respective longitudinal axes 89 are parallel to the Y (e.g., length) direction of the ECU housing 21, the planar portions 94, 104 are parallel to the Y-Z plane, and the first and second flanges 96, 108 are parallel to the X-Y plane. Each of the alpha and beta output connector pins 86 is partially embedded in the container 22 in such a way that the first electrical connection portion 90 is exposed, and disposed outside the ECU housing 21. The first electrical connection portions 90 are encircled by the shroud tubular portion 82. In addition, each of the alpha and beta output connector pins 86 is partially embedded in the container in such a way that the second electrical connection portion 91 is exposed and disposed inside the ECU housing 21. By this configuration, the second electrical connection portions 91 are able to form electrical connection with the PCB 120.

Referring to FIGS. 7-9 and 17-20, the alpha and beta output connector pins 86 are assembled with the container 22 of the ECU housing 21 in an overmolding process. As regards the alpha output connector pins 86(1), during the overmolding process, the material used to form the container 22 embeds portions of the folded portion 93 (e.g., the folded portion excluding the protrusions 93(*c*)) and the planar portion 94 including the shoulder 99, the first flange 96 and the elbow 98. In addition, the material flows around the spring element 95 and into the first flange central opening 97, the material cooperating with these elements to facilitate retention of the pins 86(1) in the desired position relative to the container 22. As regards the beta output connector pins 86(2), during the overmolding process, the material used to form the ECU housing 21 embeds the planar portion 104 including the shoulders 106, 107, the second flange 108 and the elbow 112. In addition, the material flows into the second flange central opening 109 and the cutout 110, the material cooperating with these elements to facilitate retention of the pins 86(2) in the desired position relative to the container 22 of the ECU housing 21.

The portions of the alpha and beta output connector pins 86(1), 86(2) that are embedded in the container 22 are irregularly shaped, as described above. The irregular shape of the alpha and beta output connector pins 86(1), 86(2) provides engagement with the container 22 in such a way that the alpha and beta output connector pins 86(1), 86(2) have zero degrees of freedom of movement relative to the container 22. In particular, the container 22 and pins 86(1), 86(2) are cooperatively engaged with each other such that axial movement of each pin 86(1), 86(2) in each of the X. Y and Z directions is prevented, and rotational movement of each pin 86(1), 86(2) about the X, Y and Z axes is prevented.

Figure 18:
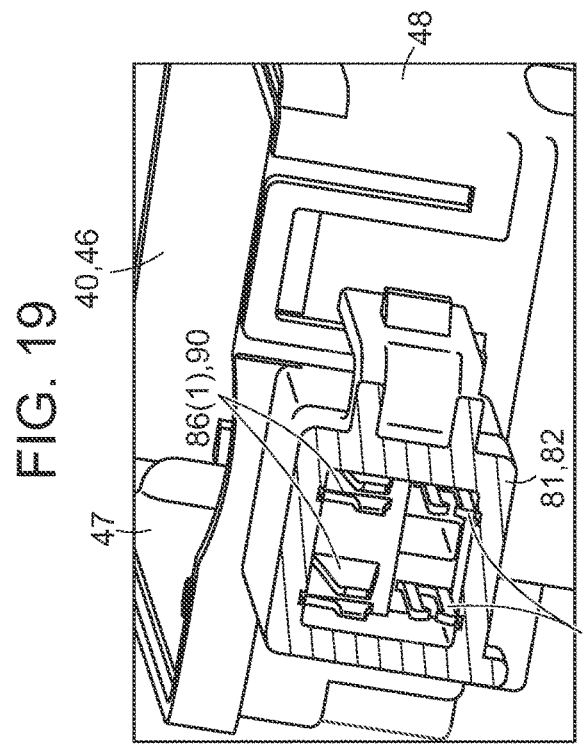
FIG. 18 is cross-sectional view of the ECU housing as seen along line 18-18 of FIG. 7.
Figure 19:
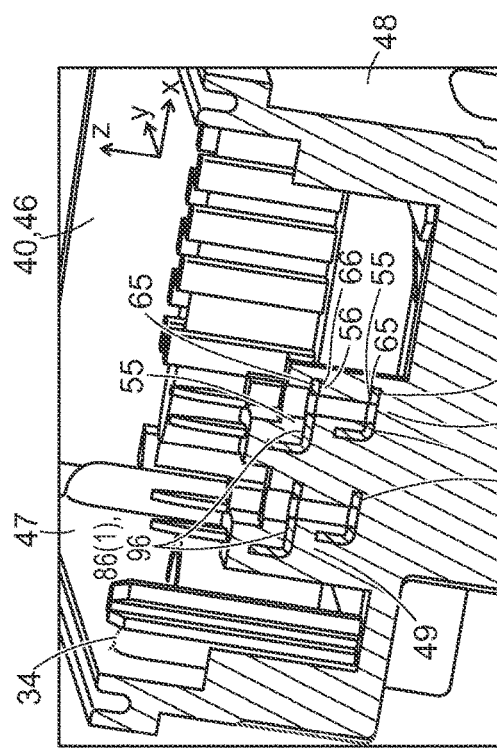
FIG. 19 is cross-sectional view of the ECU housing as seen along line 19-19 of FIG. 7.
Figure 20:
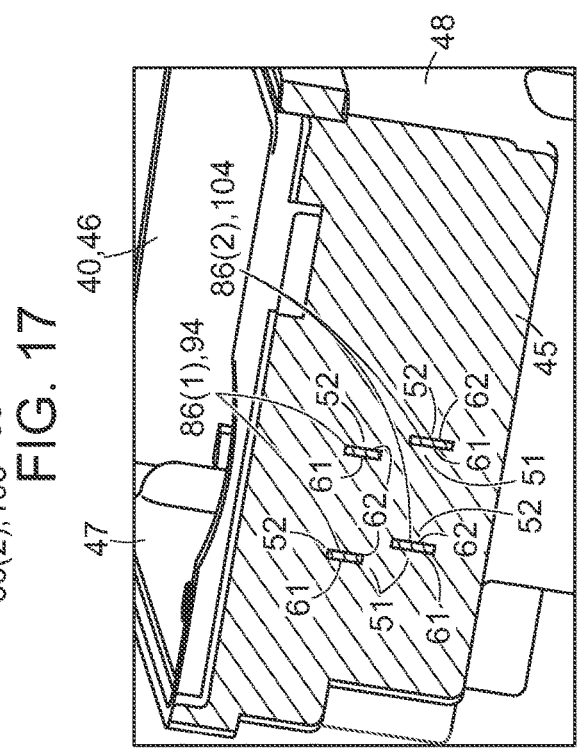
FIG. 20 is cross-sectional view of the ECU housing as seen along line 20-20 of FIG. 7.
Figure 21:
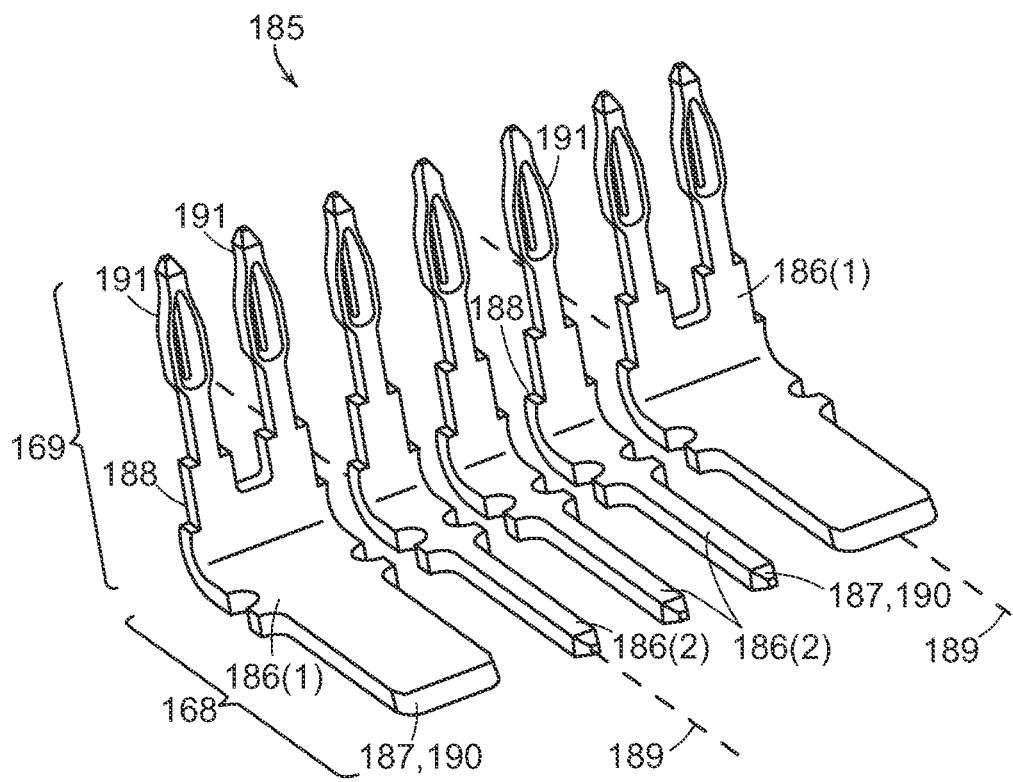
FIG. 21 is a front perspective view of the array of input connector pins.

To achieve the above-described cooperative engagement, each pin 86(1), 86(2) includes at least one pair of opposed planar surfaces that are perpendicular to the X axis, which abut corresponding surfaces of the container 22. Each alpha output connector pin 86(1) and each beta output connector pin 86(2) includes at least one pair of opposed first and second pin surfaces 61, 62, for example corresponding to opposed major sides of the planar portion 94, 104. The first pin surface 61 faces and abuts a first container portion 51, and the second pin surface 62 faces and abuts a second container portion 52 (FIG. 18). The first and second pin surfaces 61, 62 and the respective abutting surfaces of the first and second container portions 51, 52 define surfaces that are parallel to the Y-Z plane. In another example, the legs 93(*a*), 93(*b*) of the folded portion 93 are parallel to the planar portion 94, and define broad surfaces that are parallel to the Y-Z plane (FIG. 19). The legs 93(*a*), 93(*b*) of the folded portion 93 face and abut surfaces of the outer support block 84.

Figure 8:
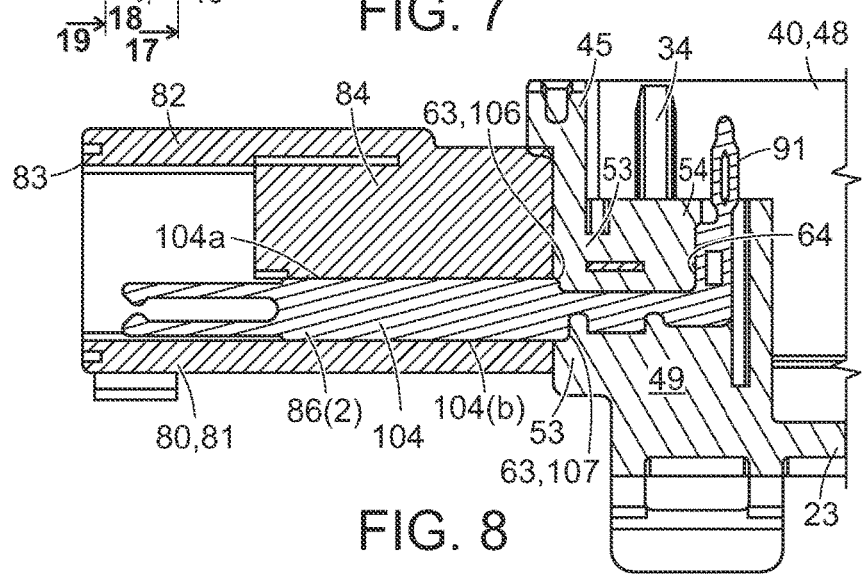
FIG. 8 is an enlargement of a portion of the cross-sectional view of FIG. 7, shown with the PCB omitted.
Figure 9:
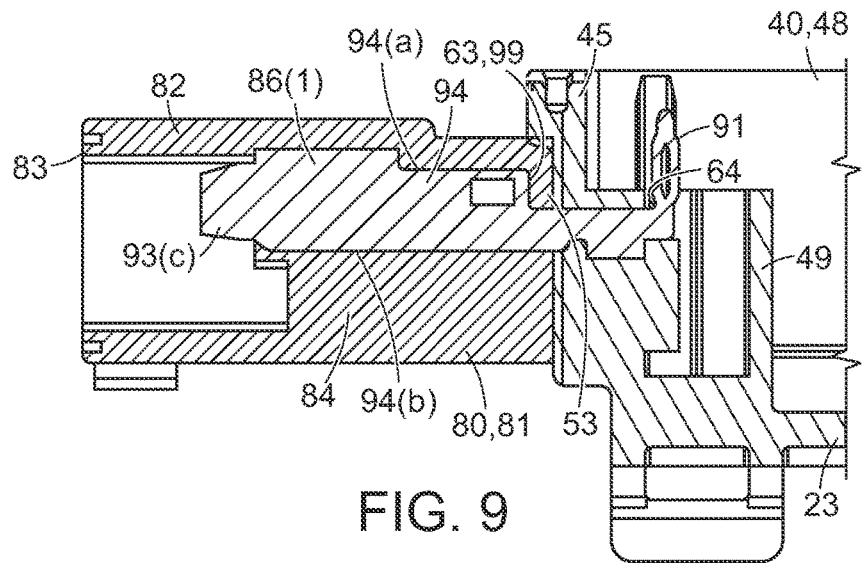
FIG. 9 is cross-sectional view of the ECU housing as seen along line 9-9 of FIG. 2 shown with the PCB omitted.
Figures 10, 11:
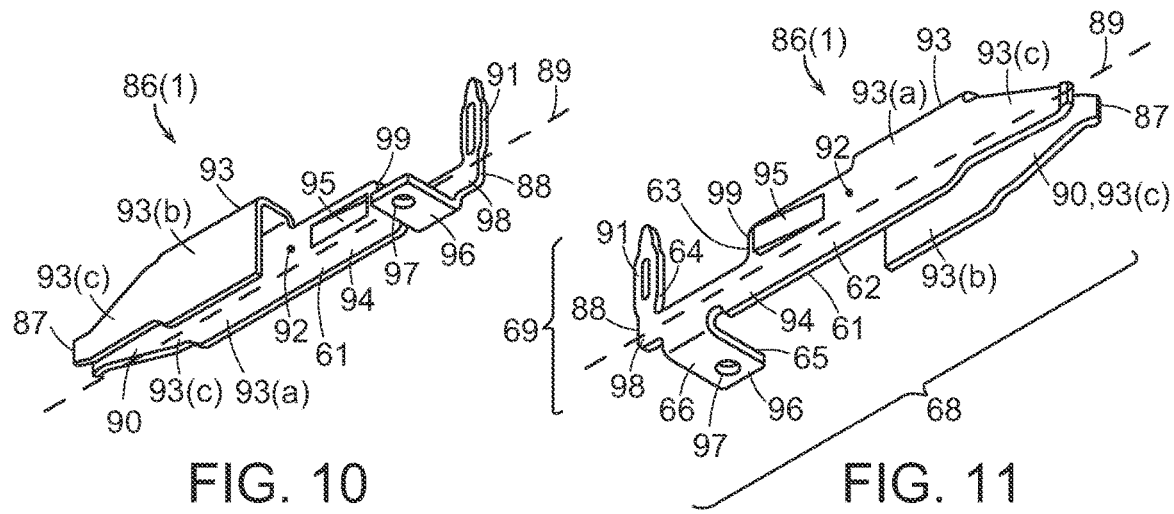
FIG. 10 is a rear perspective view of an alpha output connector pin.
FIG. 11 is a front perspective view of an alpha output connector pin.
Figures 12, 13:
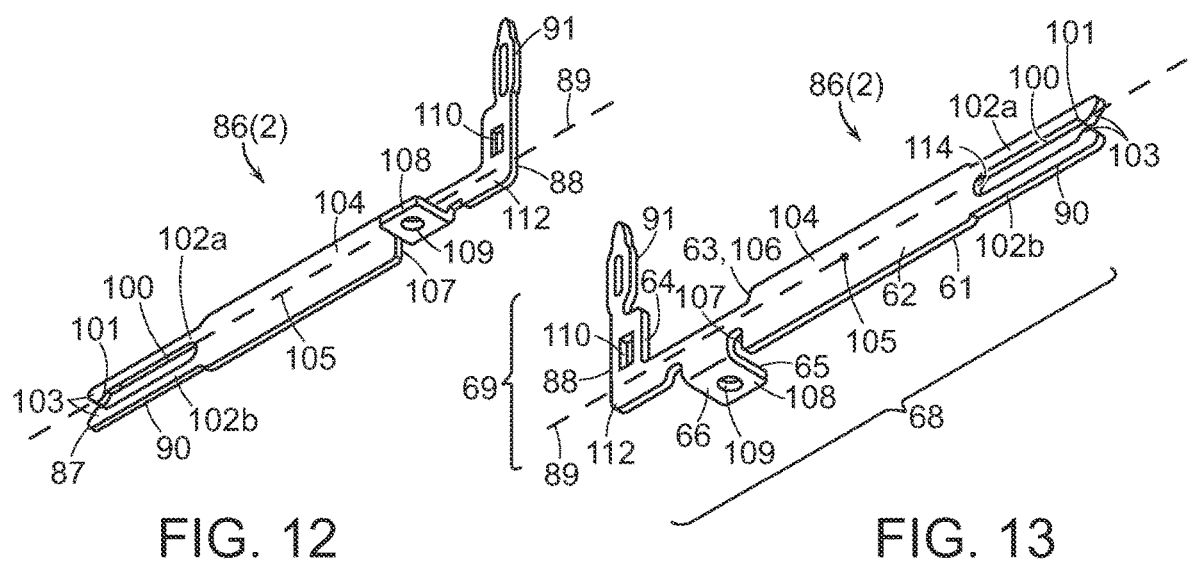
FIG. 12 is a rear perspective view of a beta output connector pin.
FIG. 13 is a front perspective view of a beta output connector pin.
Figure 14:
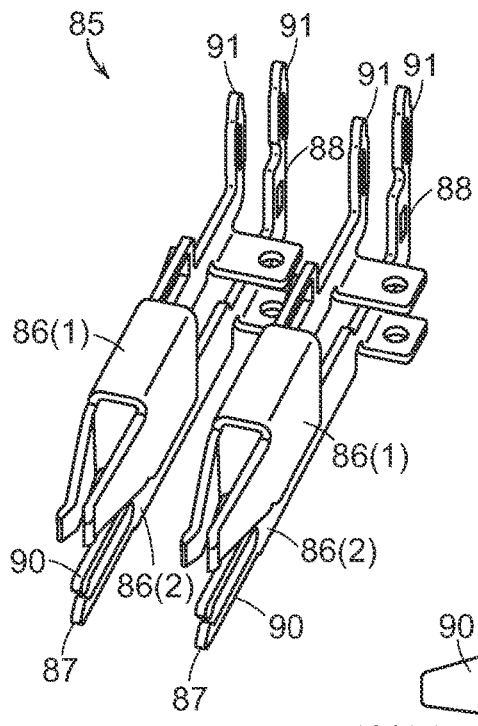
FIG. 14 is a front perspective view of array of output connector pins shown isolated from the housing.
Figure 15:
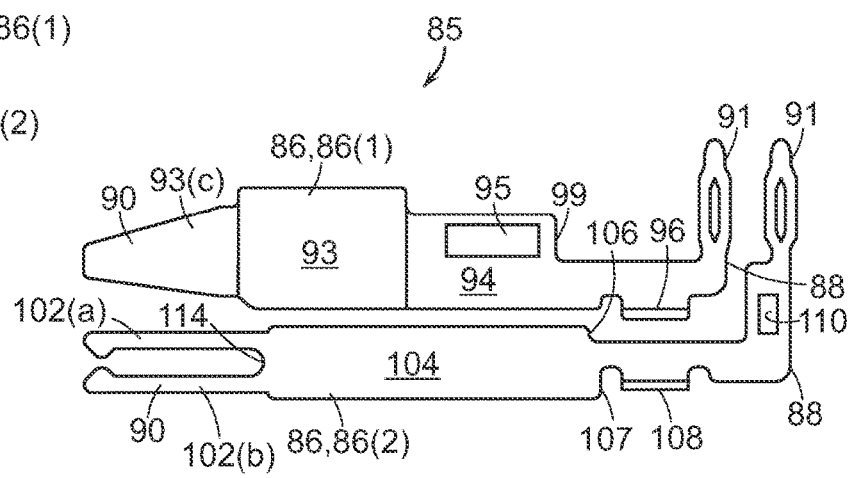
FIG. 15 is a side view of the array of output connector pins of FIG. 14.
Figure 16:
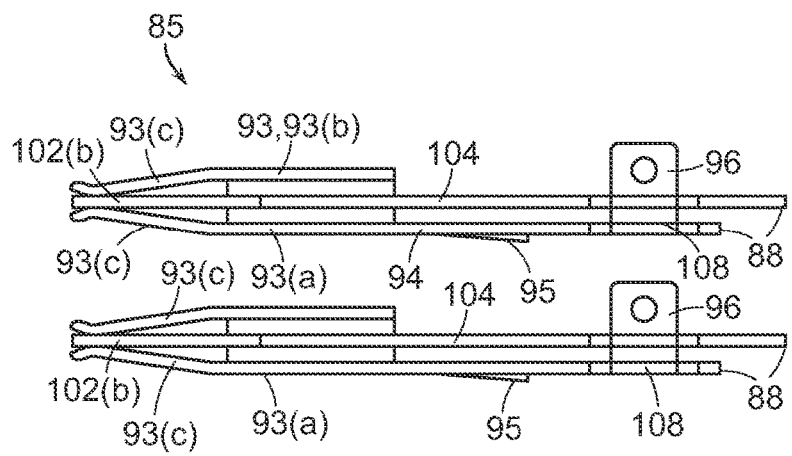
FIG. 16 is a bottom view of the array of output connector pins of FIG. 14.

Each pin 86 includes at least one pair of opposed planar surfaces that are perpendicular to the Y axis, which abut corresponding surfaces of the container 22. For example, each alpha output connector pin 86(1) and each beta output connector pin 86(2) includes opposed third and fourth pin surfaces 63, 64. For example, the third pin surface 63 corresponds to the shoulder 99, 106, 107 and the fourth pin surface 64 corresponds to a facing surface of the pin transverse portion 69 (FIGS. 8, 9). In each of the alpha and beta output connector pins 86, the third pin surface 63 faces and abuts a third container portion 53, and the fourth pin surface 64 faces and abuts a fourth container portion 54. The third and fourth pin surfaces 63, 64 and the respective abutting surfaces of the third and fourth container portions 53, 54 define surfaces that are parallel to the X-Z plane.

In another example, the opposed minor sides 94*a*, 94*b*, 104*a*, 104*b* of the planar portions 94, 104 are parallel to the broad surfaces of the first and second flanges 96, 108, and define surfaces that are parallel to the X-Y plane (FIG. 8). The opposed minor sides 94*a*, 94*b*, 104*a*, 104*b* of the planar portions 94, 104 face and abut surfaces of the outer support block 84.

Figure 17:
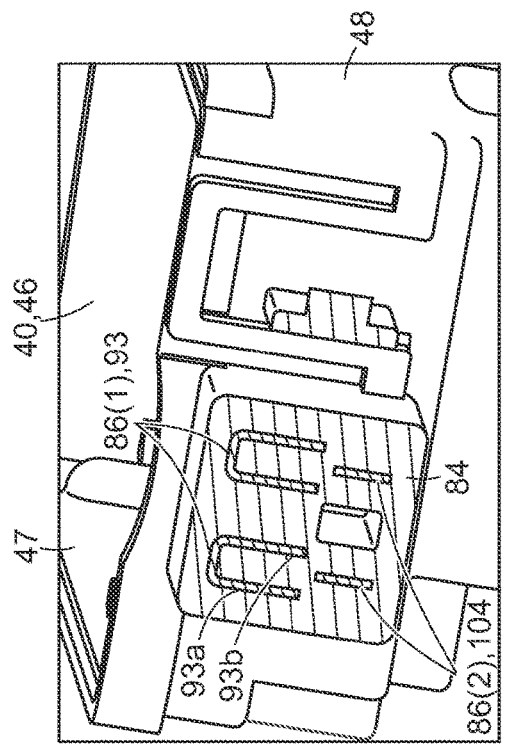
FIG. 17 is cross-sectional view of the ECU housing as seen along line 17-17 of FIG. 7.

Each pin 86 includes at least one pair of opposed planar surfaces that are perpendicular to the Z axis, which abut corresponding surfaces of the container 22. For example, each alpha output connector pin 86(1) and each beta output connector pin 86(2) includes opposed fifth and sixth pin surfaces 65, 66 corresponding to the opposed broad surfaces of the first and second flanges 96, 108. The fifth pin surface 65 faces and abuts a fifth container portion 55, and the sixth pin surface 66 faces and abuts a sixth container portion 56 (FIG. 17). The fifth and sixth pin surfaces 65, 66 and the respective abutting surfaces of the fifth and sixth container portions 55, 56 define surfaces that are parallel to the X-Y plane.

In another example, the opposed minor sides 94*a*, 94*b*, 104*a*, 104*b* of the planar portions 94, 104 are parallel to the broad surfaces of the first and second flanges 96, 108, and define surfaces that are parallel to the X-Y plane (FIG. 8). The opposed minor sides 94*a*, 94*b*, 104*a*, 104*b* of the planar portions 94, 104 face and abut surfaces of the outer support block 84.

Since each pin 86 includes at least one pair of opposed planar surfaces 61, 62 that are perpendicular to the X axis, at least one pair of opposed planar surfaces 63, 64 that are perpendicular to the Y axis, and at least one pair of opposed surfaces 65, 66 that are perpendicular to the Z axis, and since each of the planar surfaces 61, 62, 63, 64, 65 abut a corresponding surface 51, 52, 53, 54, 55, 56 of the container 22, translation of the pins 86 in any of the X, Y and Z directions is prevented. Moreover, rotation of the pins 86 about any of the X, Y and Z axes is prevented.

In use, the male second electrical connection portion 91 of each pin 86 is received in, and electrically connected to, a corresponding one of the PCB electrical connection plugs 125.

In the illustrated embodiment, the ECU output connector 80 is a multi-pin latching connector, but other embodiments may have other configurations. In the illustrated embodiment, the ECU output connector 80 is an overmolded female connector that is functionally compatible with electrical inputs found in electric drives, such as the motor unit electrical connector 6.

Referring to FIGS. 3-7 and 21, the container 22 includes the ECU input connector 180 that is formed integrally with the second sidewall portion 46. The ECU input connector 180 includes the second shroud 181, the second sidewall portion 46, the second inner buttress 50, and an array of input connector pins 186 that extend through the second shroud 181, the second sidewall portion 46 and the second inner buttress 50.

The second shroud 181 includes a second tubular portion 182. The second tubular portion 182 has the shape of a rectangular tube and protrudes outward from the outer surface of the second sidewall portion 46 in a direction perpendicular to the second sidewall portion 46. The second tubular portion 182 surrounds the array of input connector pins 186, which protrudes from the outer surface of the second sidewall portion 46. The second sidewall portion 46 and the second inner buttress 50 support the array of input connector pins 186. In some embodiments, the second tubular portion 182 is configured to permit interlocking engagement with another electrical connector.

Portions of each of the input connector pins 186 are embedded in the container 22. More specifically, portions of each of the input connector pins 186 are embedded in the outer support block 84, the first sidewall portion 45 and the first inner buttress 49. The embedded portions of the input connector pins 186 are irregularly shaped and are engaged with the container 22 in such a way that each input connector pin 186 has zero degrees of freedom of movement relative to the container 22 and is securely supported by the container 22 regardless of direction of a force applied to the pin 186.

In the illustrated embodiment, the ECU input connector 180 includes five input connector pins 186 that are arranged in a one-by-five array 185. The outermost two pins 186(1) of the array 185 are each an electrically conductive, gamma-type input connector pin, and the three intermediate pins 186(2) of the array 185 are each an electrically conductive, delta-type input connector pin. Each gamma input connector pin 186(1) is aligned with the delta input connector pins 186(2) in the width direction of the ECU housing 21 (e.g., in a direction perpendicular to the third sidewall portion 47).

Each of the of the gamma and delta input connector pins 186(1), 186(2) includes a first end 187, a second end 188 and a mid portion disposed between the first end 187 and the second end 188. In addition, each of the of the gamma and delta input connector pins 186(1), 186(2) is elongated along a longitudinal axis 189 that extends between the first end 187 and the second end 188. The first end 187 of each input connector pin 186 includes a male first electrical connection portion 190, and the second end 188 of each input connector pin 186 includes a male second electrical connection portion 191. When seen in side view (FIG. 7), the gamma and delta input connector pins 186(1), 186(2) have a generally L-shaped profile that includes a longitudinal portion 168 and a transverse portion 169. The longitudinal portion 168 is elongated in a direction that is parallel to the longitudinal axis 189, and the first electrical connection portion 190 protrudes from one end of the longitudinal portion 168. The transverse portion 169 extends in a direction that is perpendicular to the longitudinal axis 189 and away from a lid-facing surface of the base 23. The second electrical connection portion 191 protrudes from one end of the transverse portion towards the lid 30. By this configuration, the first electrical connection portion 190 extends in a direction that is perpendicular to that of the second electrical connection portion 191.

In some embodiments, each of the gamma and delta input connector pins 186(1), 186(2) may be formed of a thin strip of electrically conductive material that has been punched from a blank and folded and/or bent to achieve the illustrated configuration. As a result, the pins 186(1), 186(2) are blade-like, having a material thickness that is small relative to overall length and height. In the illustrated embodiment, the gamma input connector pins 186(1) have a pin width that is at least twice the width of the delta input connector pins 186(2). In addition, while each second electrical connection portion 191 of each delta input connector pin 186(2) is a single male connector, each second electrical connection portion 191 of each gamma input connector pin 186(1) is a double male connector.

In the illustrated embodiment, the ECU input connector 180 may be configured to receive power and data from a LIN. In the illustrated embodiment, the ECU input connector 180 is an overmolded male connector.

As discussed above, the container 22 is configured to be engaged with each output connector pin in such a way that axial movement of each output connector pin 86 in each of the x, y and z directions is prevented, and rotational movement of each pin about the x, y and z axes is prevented. In other words, portions of each of the output connector pins 86 that are embedded in the container 22 are irregularly shaped and are engaged with the container 22 in such a way that the pins 86 have zero degrees of freedom of movement relative to the container 22. This is achieved by fabricating the housing assembly with output connector pin 86 in place using an overmolding manufacturing process. The method of manufacturing the container 22 will now be described.

Figure 22:
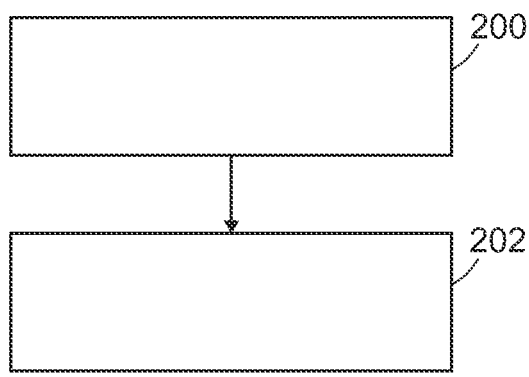
FIG. 22 is a flow chart of a method of manufacturing the ECU housing.
Figure 23:
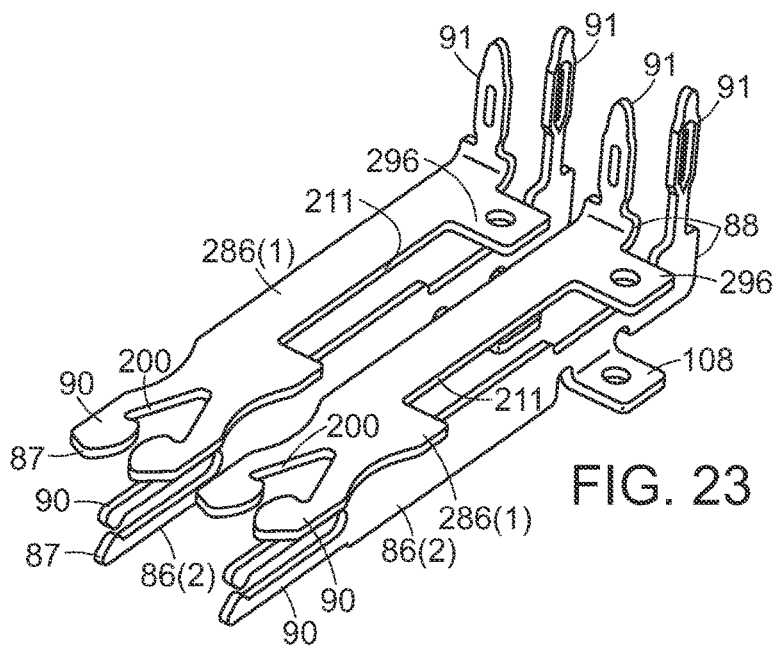
FIG. 23 is a front perspective view of an alternative embodiment array of output connector pins shown isolated from the housing.
Figure 24:
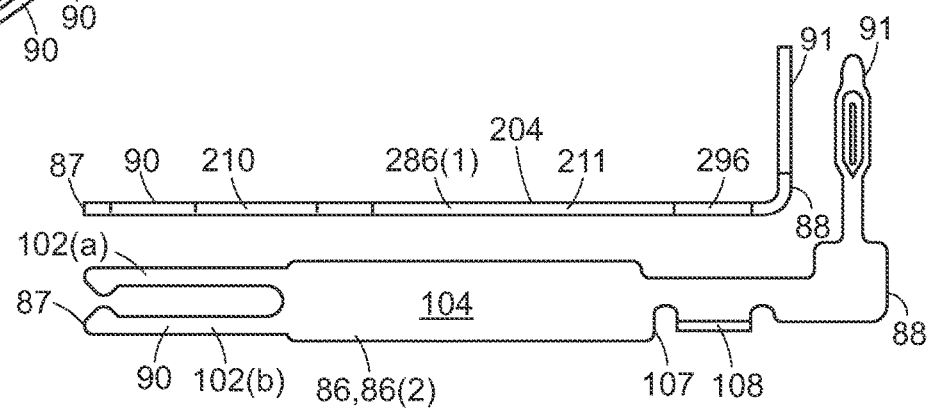
FIG. 24 is a side view of the array of output connector pins of FIG. 23.
Figure 25:
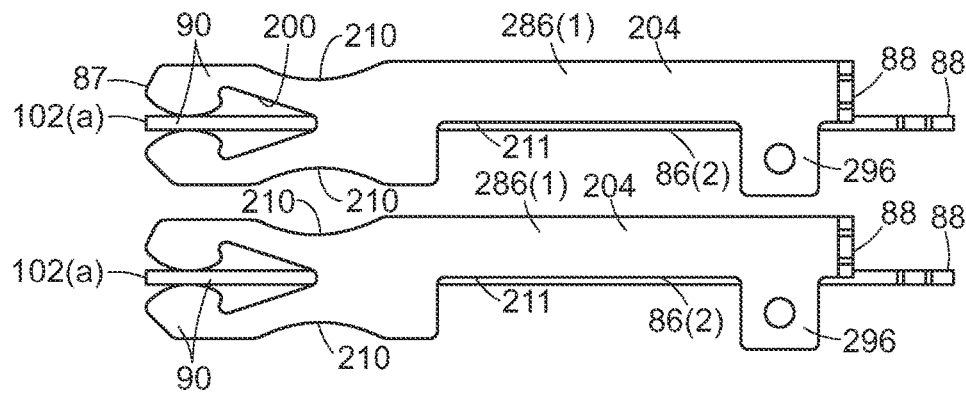
FIG. 25 is a bottom view of the array of output connector pins of FIG. 23.
Figures 26, 27:
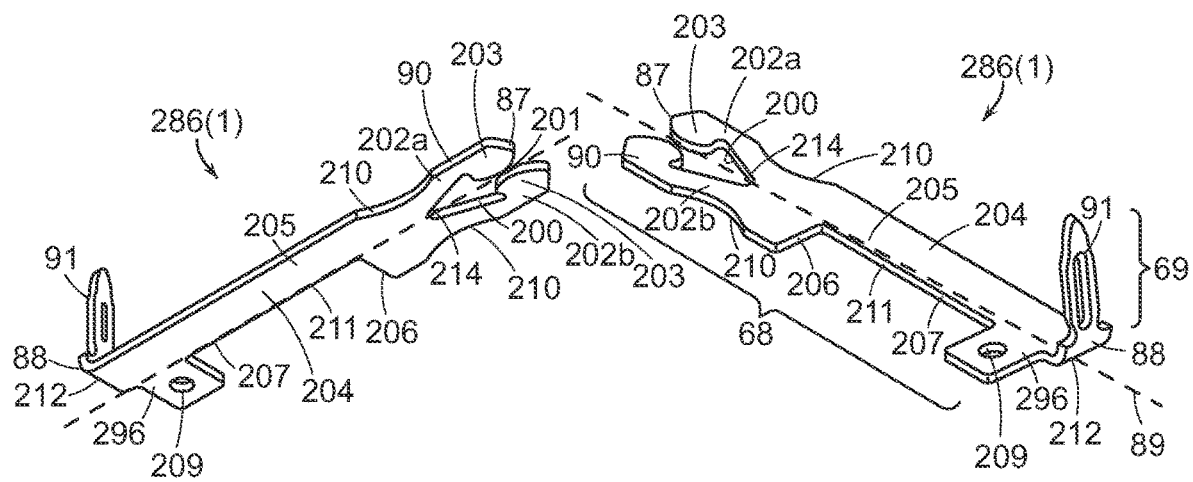
FIG. 26 is a rear perspective view of an alternative embodiment alpha output connector pin.
FIG. 27 is a front perspective view of the alpha output connector pin of FIG. 10.
Figure 28:
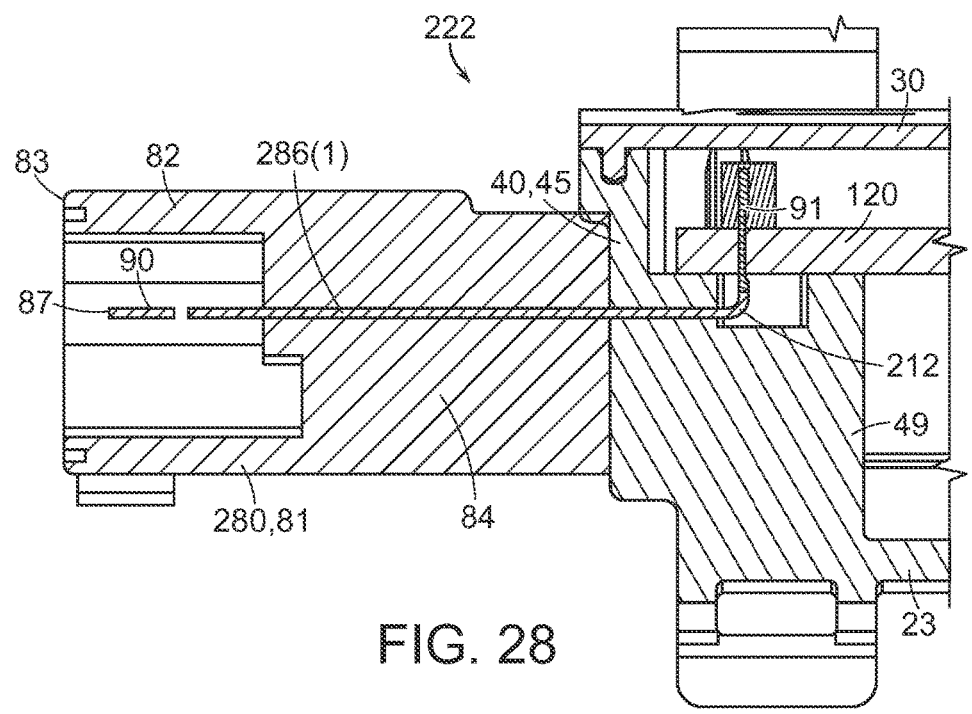
FIG. 28 is a side cross-sectional view of a portion of the ECU housing including the array of output connector pins of FIG. 23.
Figure 29:
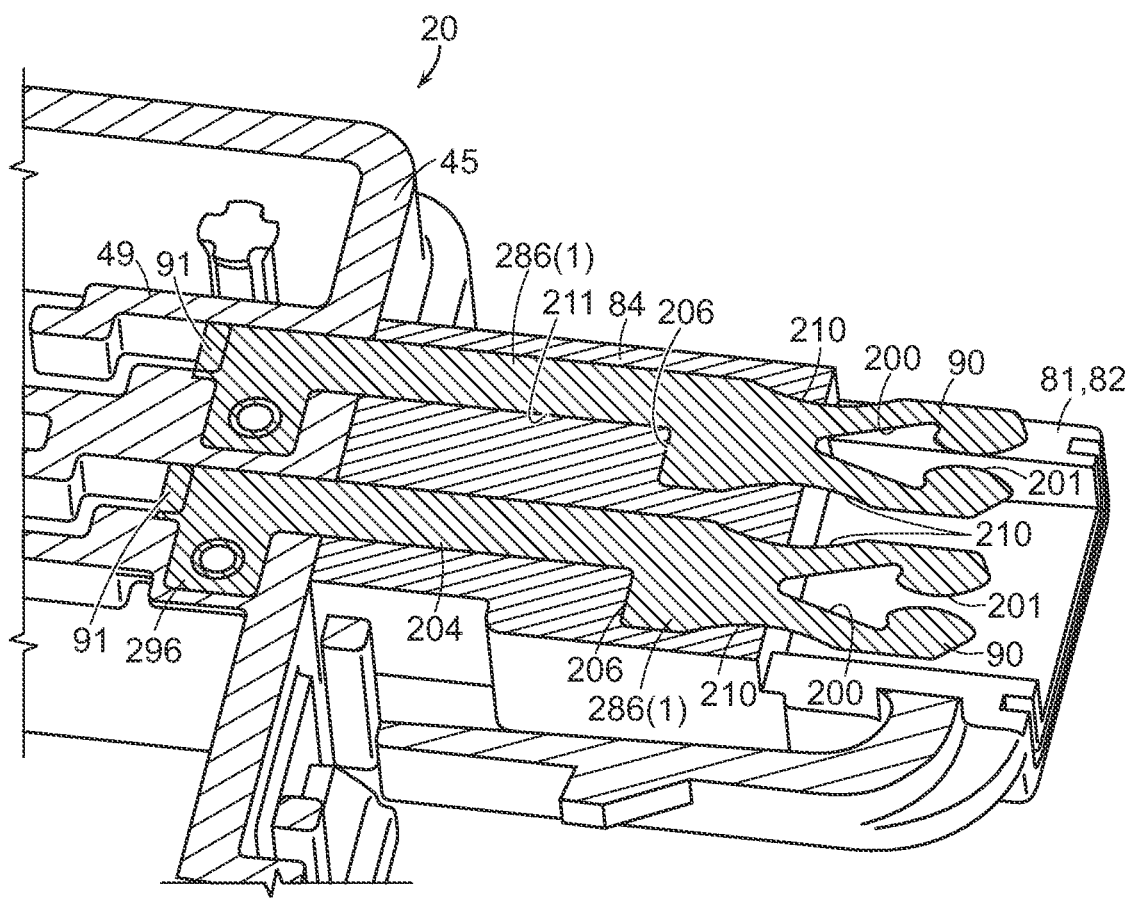
FIG. 29 is a top cross-sectional view of a portion of the ECU housing including the array of output connector pins of FIG. 23.

Referring to FIG. 22, the method of manufacturing a housing assembly (for example, container 22) includes the following method steps. In a first step (step 200), the electrically conductive output connector pins 86(1), 86(2) and the input connector pins 186(1), 186(2) are provided. In particular, the output connector pins 86(1), 86(2) and the input connector pins 186(1), 186(2) are arranged in arrays as appropriate for the application, which are then placed in a vacancy of an injection mold (not shown). Following the first step, the container 22 is overmolded (e.g., insert molded) on the output connector pins 86(1), 86(2) and the input connector pins 186(1), 186(2) (step 202) using material injection into the mold in such a way that each pin 86(1), 86(2), 186(1), 186(2) is partially embedded in a portion of the container 22. In particular, each pin 86(1), 86(2), 186(1), 186(2) is partially embedded in such a way that the first electrical connection portion 90, 190 is disposed outside the container 22, the second electrical connection portion 91, 191 is disposed inside the container 22, and portions of the pins 86(1), 86(2), 186(1), 186(2) that are embedded in the container material are engaged with the container 22 in such a way that the pins 86(1), 86(2), 186(1), 186(2) have zero degrees of freedom of movement relative to the container. The lid 30 of the ECU housing 21 is molded separately from the container 22, and is attached to the container open end 28 following installation of the PCB 120.

Referring to FIGS. 23-29, an alternative embodiment container 222 is similar the to container 22 described above, and common reference numbers are used to refer to common elements. The alternative embodiment container 222 differs from the container 22 described above in that it includes an alternative embodiment ECU output connector 280 that is formed integrally with the first sidewall portion 45. The ECU output connector 280 differs from the output connector 80 described above in that the ECU output connector 280 includes alternative alpha connector pins 286(1) in an array 285 that also includes the beta connector pins 82(2) described above with respect to FIGS. 12 and 13. In particular, the ECU output connector 280 includes four output connector pins 86 that are arranged in a two-by-two array 285. The two alpha connector pins 286(1) are disposed in the array upper row, and the two beta connector pins 86(2) are disposed on the array lower row. Each alpha output connector pin 286(1) is aligned with a beta output connector pin 86(2) in the height direction of the ECU housing 21 (e.g., in a direction perpendicular to the base 23) and aligned with the other alpha output connector pin 286(1) in the width direction of the ECU housing 21 (e.g., in a direction perpendicular to the third sidewall portion 47). Each beta output connector pin 86(2) is aligned with the other beta output connector pin 86(2) in the width direction of the ECU housing 21. Details of the configuration of the alpha output connector pins 286(1), and of engagement between the alpha output connector pins 286(1), 86(2) and the container 222 will now be described in detail.

Each of the of the alpha output connector pins 286(1) includes a first end 87, a second end 88 and a mid portion disposed between the first end 87 and the second end 88. In addition, each of the of the alpha output connector pins 286(1) is elongated along a longitudinal axis 89 that extends between the first end 87 and the second end 88. The first end 87 of each alpha output connector pin 286(1) includes a female first electrical connection portion 90, and the second end 88 of each alpha output connector pin 286(1) includes a male second electrical connection portion 91. When seen in side view (FIG. 24), the alpha output connector pins 286(1) have a generally L-shaped profile that includes a longitudinal portion 68 and a transverse portion 69. The longitudinal portion 68 is elongated in a direction that is parallel to the longitudinal axis 89, and the first electrical connection portion 90 protrudes from one end of the longitudinal portion 68. The transverse portion 69 extends in a direction that is perpendicular to the longitudinal axis 89 and away from a lid-facing surface of the base 23. The second electrical connection portion 91 protrudes from one end of the transverse portion towards the lid 30. By this configuration, the first electrical connection portion 90 extends in a direction that is perpendicular to that of the second electrical connection portion 91.

In some embodiments, each of the alpha output connector pins 286(1) may be formed of a thin strip of electrically conductive material that has been punched from a blank and folded and/or bent to achieve the illustrated configuration. As a result, the alpha output connector pins 286(1) are blade-like, having a material thickness that is small relative to overall length and height.

Each of the alpha output connector pins 286(1) includes an elongated slot 200 that opens at the pin first end 87 and defines a portion of the first electrical connection portion 90 of the alpha output connector pins 286(1). In the illustrated embodiment, the slot 200 is elongated in a direction parallel to the longitudinal axis 89, and a longitudinal dimension of the slot 200 is in a range of 10 percent to 30 percent of the length of the alpha output connector pin 286(1). The slot 200 has a necked portion 201 adjacent the pin first end 87. The slot 200 is tapered in the region between the necked portion 201 and a blind end 214 of the slot 200 so as to have a minimum dimension at the blind end 214. The remainder of the first electrical connection portion 90 of the alpha output connector pins 286(1) is formed by the pin material that surrounds the slot 200. This material defines opposed, parallel arms 202(a), 202(b). Each of the parallel anus 202(a), 202(b) has an inward protrusion 203 corresponding to the necked portion 201 of the slot 200. In addition, each of the parallel arms 202(a), 202(b) includes a shallow, curved cut out 210 that is formed along an edge of each arm 202(a), 202(b) that faces away from the slot 200. When viewed in top plan view (FIG. 25), the curved cut outs 210 have a maximum depth at a location aligned with the slot blind end 214. In use, male pins of a mating electrical connector (not shown) are received in the slot 200, and the inward protrusions 203 serve as teeth that engage, and form an electrical connection with, an outer surface of the male pins.

Each of the alpha output connector pins 286(1) includes a planar portion 204 disposed between the first electrical connection portion 90 and the second end 88. The planar portion 204 includes the midpoint 205 of the alpha output connector pin 286(1). The height dimension of the planar portion 204 corresponds to the thickness of the plate used to form the pin, whereas the width dimension of the planar portion 204 is about twenty percent of the length dimension of the pin 286(1). The width dimension of the planar portion 204 is non-uniform since a rectangular cut out 211 is provided on one peripheral edge thereof. A shoulder 206 is formed at the transition in widths, and the shoulder 206 faces the second end 88. A first flange 296 is provided in the planar portion 204 at a location between the midpoint 208 and the second end 88. The first flange 296 protrudes from a blind edge 207 of the rectangular cut out 211 in a direction perpendicular to the longitudinal axis 89, and includes a central opening 209. The first flange 296 is coplanar with the planar portion 204.

The elbow 212 of the alpha output connector pin 286(1) that provides the pin 286(1) with an L shape is disposed between the first flange 296 and the pin second end 88. Due to the elbow 212, the male second electrical connection portion 91 extends in a direction perpendicular to the longitudinal axis 89.

In each of the alpha output connector pins 286(1), the first electrical connection portion 90 and the planar portion 204 lie in a first plane that includes the longitudinal axis 89(1), and the elbow 212 and the second electrical connection portion 91 lie in a second plane that is perpendicular to the longitudinal axis 89(1). In use, the first plane is parallel to the container base 23, and the second plane is perpendicular to the container base 23.

The alpha output connector pins 286(1) have a length dimension (e.g., the distance between the first and second ends 87, 88 of the pins 86(1)) that is much greater than their width and height dimensions. For example, the alpha output connector pins 286(1) may a length that is at least three times that of the width and height dimensions. In addition, the alpha output connector pins 286(1) have a width dimension that is greater than the height dimension. The thickness of the material used to form the alpha output connector pins 286(1) is very small relative to that of the length, height or width of the pins 286(1). For example, in the illustrated embodiment, the length of the alpha output connector pin 286(1) is at least 50 times the thickness of the material used to form the alpha output connector pin 286(1).

In the array 285, the alpha and beta output connector pins 286(1), 86(2) are oriented so that the first flange 296 of an alpha output connector pin 286(1) overlies the second flange 108 of the beta output connector pin 86(2) and so that the respective central openings 209, 109 are aligned in the z axis direction. In the array 285, the first end 87 of the alpha output connector pin 286(1) overlies the first end 87 of the beta output connector pin 86(2), and is flush with the first end 87 of the beta output connector pin 86(2) in the longitudinal direction. In addition, the longitudinal axis 89 of the alpha output connector pin 86(1) is aligned with the longitudinal axis 89 of the beta output connector pin 86(2) in the X direction. Still further, the second electrical connection portion 91 of the alpha output connector pins 286(1) are flush with the second electrical connection portion 91 of the beta output connector pins 86(2) in a height, or Z, direction.

Each of the alpha and beta output connector pins 86 is partially embedded in the container 22 in such a way that the respective longitudinal axes 89 are parallel to the Y (e.g., length) direction of the ECU housing 21. The planar portion 204 of the alpha output connector pins 286(1) is parallel to the X-Y plane, whereas the planar portions 104 of the beta output connector pins 86(2) are parallel to the Y-Z plane, and the first and second flanges 96, 108 are parallel to the X-Y plane. The second electrical connection portions 91 of the alpha output connection pins 286(1) reside in the X-Z plane whereas the second electrical connection portion 91 of the beta output connection pins 86(2) reside in the Y-Z plane. Each of the alpha and beta output connector pins 286(1). 86(2) is partially embedded in the container 22 in such a way that the first electrical connection portion 90 is exposed, and disposed outside the ECU housing 21. The first electrical connection portions 90 are encircled by the shroud tubular portion 82. In addition, each of the alpha and beta output connector pins 286(1), 86(2) is partially embedded in the container in such a way that the second electrical connection portion 91 is exposed and disposed inside the ECU housing 21. By this configuration, the second electrical connection portions 91 are able to form electrical connection with the PCB 120.

Like the previous embodiment, the alpha and beta output connector pins 286(1), 86(2) are assembled with the container 222 of the ECU housing 21 in an overmolding process. As regards the alpha output connector pins 286(1), during the overmolding process, the material used to form the container 222 embeds the planar portion 204 including the cut out 205, the shoulder 206 and first flange 296. In addition, the material also embeds a portion of the curved cut out 210. In particular, the material may embed the alpha output connector pins 286(1) between the first flange 296 and the blind end 214 of the slot 200.

The portions of the alpha and beta output connector pins 286(1). 86(2) that are embedded in the container 22 are irregularly shaped, as described above. The irregular shape of the alpha and beta output connector pins 286(1), 86(2) provides engagement with the container 22 in such a way that the alpha and beta output connector pins 286(1), 86(2) have zero degrees of freedom of movement relative to the container 222. In particular, the container 222 and pins 286(1), 86(2) are cooperatively engaged with each other such that axial movement of each pin 286(1). 86(2) in each of the X, Y and Z directions is prevented, and rotational movement of each pin 286(1). 86(2) about the X, Y and Z axes is prevented.

Selective illustrative embodiments of the housing assembly for an ECU are described above in some detail. It should be understood that only structures considered necessary for clarifying the housing assembly have been described herein. Other conventional structures, and those of ancillary and auxiliary components of the housing assembly and ECU, are assumed to be known and understood by those skilled in the art. Moreover, while a working example of the housing assembly has been described above, the housing assembly are not limited to the working examples described above, but various design alterations may be carried out without departing from the housing assembly as set forth in the claims.

We claim:

1. A housing assembly, comprising:
a housing that includes a container and a lid,
the container including
a base, and
a sidewall that protrudes from base in a direction perpendicular to the base, a first end of the sidewall being connected to the base, and a second end of the sidewall defining a container opening,
the lid being shaped and dimensioned to close the container opening; and
at least two electrically conductive pins that extend through a first portion of the sidewall,
wherein
one of the electrically conductive pins is an alpha output connector pin,
another of the electrically conductive pins is a beta output connector pin,
a first end of each pin includes a first electrical connection portion,
a second end of each pin includes a second electrical connection portion, and
portions of the pins are engaged with the container in such a way that each pin has zero degrees of freedom of movement relative to the container.

2. The housing assembly of claim 1, wherein the first electrical connection portion has a female electrical connection configuration.

3. The housing assembly of claim 1, comprising a printed circuit board disposed inside the housing, the printed circuit board comprising electrical connection plugs, the second electrical connection portion of each pin being electrically connected to a corresponding one of the electrical connection plugs.

4. The housing assembly of claim 1, wherein a portion of each pin is embedded in the container, and the portion has an L shaped profile.

5. The housing assembly of claim 1, wherein each pin has a through opening, and each through opening is filled with material used to form the container fills the through opening.

6. The housing assembly of claim 1, wherein each alpha output connector pin and each beta output connector pin has a flange that protrudes from a surface of the respective pin.

7. The housing assembly of claim 1, wherein at least some of the pins have an integral spring element that protrudes from a side surface of the respective pin.

8. The housing assembly of claim 1, wherein the pins are fixed relative to the container via an overmolding, manufacturing, process.

9. The housing assembly of claim 1, wherein
the housing has
a height dimension corresponding to a distance along a Z axis between an outer surface of the base and an outer surface of the lid, a length dimension corresponding to a distance along a Y axis between an outer surface of the first portion of the sidewall and an outer surface of a second portion of the sidewall that is parallel to, and spaced apart from, the first portion of the sidewall, and a width dimension corresponding to a distance along an X axis between a third portion of the sidewall and a fourth portion of the sidewall, the third and fourth portions of the sidewall being perpendicular to the first and second portions of the sidewall and spaced apart from each other, the X, Y and Z axes are mutually orthogonal, the container is configured to prevent axial movement of each pin relative to the X, Y and Z axes, and to prevent rotational movement of each pin about the X, Y and Z axes.

10. The housing assembly of claim 9, wherein each alpha output connector pin and each beta output connector pin includes a first pair of opposed planar surfaces that are perpendicular to the X axis, a second pair of opposed planar surfaces that are perpendicular to the Y axis, and a third pair of opposed planar surfaces that are opposed to the Z axis, and each of the first pair, second pair and third pair of opposed planar surfaces abuts the container, whereby the container is configured to prevent axial movement of each pin relative to the X, Y and Z directions, and to prevent rotational movement of each pin about the X, Y and Z axes.

11. The housing assembly of claim 1, wherein the container includes an inner buttress that adjoins the first portion of the sidewall so as to protrude inward from an inner surface of the sidewall, and an outer support block that adjoins the first portion of the sidewall so as to protrude outward from an outer surface of the sidewall, and each pin extends through the first portion of the sidewall, the inner buttress and the outer support block.

12. The housing assembly of claim 11, wherein the outer support block is encircled by a tubular shroud.

13. The housing assembly of claim 11, wherein the container includes a shroud that protrudes outwardly from the first portion of sidewall, the shroud surrounding the first ends of the pins and defining an outer opening configured to engage with corresponding mating connector.

14. A housing assembly, comprising:

a housing that includes a container and a lid, the container including a base, a sidewall that protrudes from base it a direction perpendicular to the base, a first end of the sidewall being connected to the base, and a second end of the sidewall defining a container opening, the lid being shaped and dimensioned to close the container opening; and at least two electrically conductive pins that extend through a first portion of the sidewall, one of the electrically conductive pins being an alpha output connector pin, another of the electrically conductive pins is a beta output connector pin, each pin including:

a first end that includes a female first electrical connection portion;

a second end that includes a second electrical connection portion;

a longitudinal portion that extends in a first direction that is perpendicular to the first portion of the sidewall, the longitudinal portion including the first electrical connection portion, the first electrical portion oriented to form an electrical connection in a direction parallel to the first direction, and a transverse portion that extends in a second direction that is perpendicular to the longitudinal axis and a lid-facing surface of the base, the transverse portion including the second electrical connection portion, the second electrical connection portion oriented to form an electrical connection in a direction parallel to the second direction, wherein each pin is partially embedded in the container, and an embedded portion of the pin is engaged with the container in such a way that the pin has zero degrees of freedom of movement relative to the container.

15. A method of manufacturing a housing assembly that includes a housing and pins that protrude from the housing, the method comprising the following method steps:

providing electrically conductive pins, wherein one of the electrically conductive pins is an alpha output connector pin and another of the electrically conductive pins is a beta output connector pin, each pin including a first end, the first end having a female first electrical connection portion, a second end, the second end opposed to the first end and having a second electrical connection portion, and a midportion disposed between the first end and the second end, the midportion having an elbow shape such that the first end extends along a first axis and the second end extends along a second axis that is perpendicular to the first axis, and forming the housing about the pins so that each pin is partially embedded in a portion of the housing, and portions of the pin that are embedded in the housing are engaged with the housing fir such a way that the pin has zero degrees of freedom of movement relative to the housing.

16. The method of claim 15, wherein the step of forming the housing includes an overmolding process in which the pins are partially embedded.

17. The method of claim 15, wherein the step of forming the housing includes forming a container that has a base, and a sidewall that protrudes from base in a direction perpendicular to the base, a first end of the sidewall being connected to the base, and a second end of the sidewall defining a container opening.

18. The method of claim 15, wherein the step of providing electrically conductive pins includes arranging the pins in an array in which each pin is spaced apart from and parallel to an adjacent pin of the array, and the step of providing electrically conductive pins is performed before the step of forming the housing.

* * * * *

UNITED STATES PATENT AND TRADEMARK OFFICE
CERTIFICATE OF CORRECTION

| | |
|---|---|
| PATENT NO. | : 11,765,843 B2 |
| APPLICATION NO. | : 17/235092 |
| DATED | : September 19, 2023 |
| INVENTOR(S) | : Ortiz et al. |

It is certified that error appears in the above-identified patent and that said Letters Patent is hereby corrected as shown below:

In the Claims

In Claim 15, at Column 20, Line 44: "fir such a way" should read --in such a way--.

Signed and Sealed this
Twenty-eighth Day of November, 2023

*Katherine Kelly Vidal*

Katherine Kelly Vidal
*Director of the United States Patent and Trademark Office*